US007994005B2

(12) United States Patent
Hébert

(10) Patent No.: US 7,994,005 B2
(45) Date of Patent: Aug. 9, 2011

(54) HIGH-MOBILITY TRENCH MOSFETS

(75) Inventor: François Hébert, San Mateo, CA (US)

(73) Assignee: Alpha & Omega Semiconductor, Ltd, Hamilton (BM)

( * ) Notice: Subject to any disclaimer, the term of this patent is extended or adjusted under 35 U.S.C. 154(b) by 676 days.

(21) Appl. No.: 11/934,040

(22) Filed: Nov. 1, 2007

(65) Prior Publication Data

US 2009/0114949 A1 May 7, 2009

(51) Int. Cl.
*H01L 21/336* (2006.01)
(52) U.S. Cl. . 438/270; 257/330; 257/341; 257/E21.418; 257/E29.256
(58) Field of Classification Search .......... 438/212, 438/268–270; 257/328–331, 335, 341, E21.418, 257/E29.256
See application file for complete search history.

(56) References Cited

U.S. PATENT DOCUMENTS

| 5,072,266 | A | 12/1991 | Bulucea et al. |
| 5,283,201 | A | 2/1994 | Tsang et al. |
| 5,541,425 | A | 7/1996 | Nishihara |
| 5,578,508 | A | 11/1996 | Baba et al. |
| 5,866,931 | A | 2/1999 | Bulucea et al. |
| 5,998,833 | A | 12/1999 | Baliga |
| 6,388,286 | B1 | 5/2002 | Baliga |
| 6,756,273 | B2* | 6/2004 | Hadizad et al. ............. 438/269 |
| 7,176,524 | B2* | 2/2007 | Loechelt et al. ............ 257/341 |
| 7,238,985 | B2* | 7/2007 | Jones et al. ................. 257/330 |
| 7,265,415 | B2* | 9/2007 | Shenoy et al. .............. 257/330 |
| 7,504,691 | B2* | 3/2009 | Park et al. .................. 257/329 |

OTHER PUBLICATIONS

Michael Losinski et al., "Higher Mobility MOSFETS", which may be accessed at: http://www.d.umn.edu/~sburns/ ECE3611Spring2005/Higher%20Mobility%20MOSFETS.doc.
"A 90 nm High Volume Manufacturing Logic Technology Featuring Novel 45 nm Gate Length Strained Silicon CMOS Transistors" by Ghani et al, Dec. 2003.(article format).
"A 90 nm High Volume Manufacturing Logic Technology Featuring Novel 45 nm Gate Length Strained Silicon CMOS Transistors" by Ghani et al, Dec. 2003.(power presentation format).
"Fully Self-Consistent Schrodinger Monte Carlo Transport Modeling of p-channel Strained SiGe MOSFETs" by Krishnan et al.
"Intel's 90 nm Logic Technology Using Strained Silicon Transistors" by Mark Bohr, Dec. 2003.

* cited by examiner

*Primary Examiner* — David Vu
(74) *Attorney, Agent, or Firm* — Joshua D. Isenberg; JDI Patent

(57) ABSTRACT

High-mobility vertical trench DMOSFETs and methods for manufacturing are disclosed. A source region, a drain region or a channel region of a high-mobility vertical trench DMOSFET may comprise silicon germanium (SiGe) that increases the mobility of the charge carriers in the channel region. In some embodiments the channel region may be strained to increase channel charge carriers mobility.

9 Claims, 27 Drawing Sheets

HIGH-MOBILITY TRENCH MOSFETS

FIELD OF THE INVENTION

This invention generally relates to trench-metal oxide silicon field effect transistors (trench-MOSFETs) and more particularly to high-mobility trench-MOSFETs.

BACKGROUND OF THE INVENTION

A DMOS (Double Diffused MOS) transistor is a type of MOSFET (Metal Oxide Semiconductor Field Effect Transistor) that uses diffusion to form the transistor region. DMOS transistors are typically employed as power transistors for power integrated circuits. DMOS transistors provide high current per unit area where low forward voltage drops are required.

One particular type of DMOS transistor is a so-called "trench" DMOS transistor in which the channel is formed vertically and the gate is formed in a trench extending between the source and drain. The trench, which is lined with a thin oxide layer and filled with polysilicon (i.e., polycrystalline silicon), allows less constricted current flow and thereby provides lower values of specific on-resistance. Examples of trench DMOS transistors are disclosed in U.S. Pat. Nos. 5,072,266, 5,541,425, and 5,866,931, which are incorporated herein by reference.

The trench DMOS transistor may include a plurality of interconnected trenches form on a semiconductor substrate. At least one of the interconnected trenches constitutes a shielded gate trench (SGT) structure, which includes a trenched gate disposed on an upper portion of the SGT structure and a bottom shielding electrode disposed on a bottom portion of the SGT structure insulated from the trenched gate.

FIG. 1 is a cross-sectional view illustrating a prior art SGT DMOS 100. The SGT DMOS 100 includes an N+ substrate 101 functioning as a drain electrode, a drain layer 102, upon which is grown a lightly doped N− epitaxial layer 104 of a predetermined depth. Within the N-epi layer 104, P− body region 106 (p, p+) is provided. In the design shown, the P− body region 106 is substantially planar, lying below the top surface of the N− epitaxial layer 104. Another layer 108 (n+) overlying most of the p-body region 106 serves as source. A trench 109 is provided in the N− epitaxial layer 104, opening toward the top and having a predetermined depth. The trench 109 is typically lined with oxide and filled with conductive polysilicon, forming a trenched gate 110 and a gate shield 112 for the DMOS device 100. Examples of trench SGT DMOS transistors are disclosed in U.S. Pat. Nos. 5,283,201, 5,578, 508, 5,998,833 and 6,388,286, which are incorporated herein by reference.

A problem with prior art trench DMOS transistors is that the channel mobility tends to remain low (especially P channel devices) due to the limited mobility of silicon. Especially for low voltage applications, this results in relatively high drain-source resistance ($R_{dson}$) since the channel resistance dominates operation of the DMOS transistors in such applications. There is no improvement in mobility for standard MOSFETs; therefore, drain to source resistance $R_{dson}$ can be significant at low voltages.

Planar devices are typically used in integrated circuits. Unfortunately, in addition to relatively low channel mobility, planar MOSFETs tend to have a large cell pitch because of the horizontal structure of the channel and drain, source and gate. Improvements in Planar MOSFETs have been reported which incorporate means of increasing the channel mobility. Certain improvements may involve the use of a Silicon-Germanium (SiGe) channel or a strained channel. These devices are still planar in nature however and tend to have a large cell pitch, and relatively high "$R_{dson}$* Area" figure of merit It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

According to embodiments of the present invention, high mobility trench-DMOS field effect transistors, with single gate or shielded gate structure, may be achieved through use of a SiGe sidewall channel and/or a channel strained by SiGe-Source or SiGe-Source-Drain regions applied to NMOS and PMOS vertical channel trench structures. SiGe has recently become widely available in multiple Silicon Semiconductor Facilities. The advantages of using SiGe in low voltage (LV) trench-DMOSFETS include high-mobility the in channel region and minimizing $R_{dson}$, small cell pitch by using vertical channel structures, high-power density when combined with Vertical MOSFET technology (drain at bottom).

Figure 1:
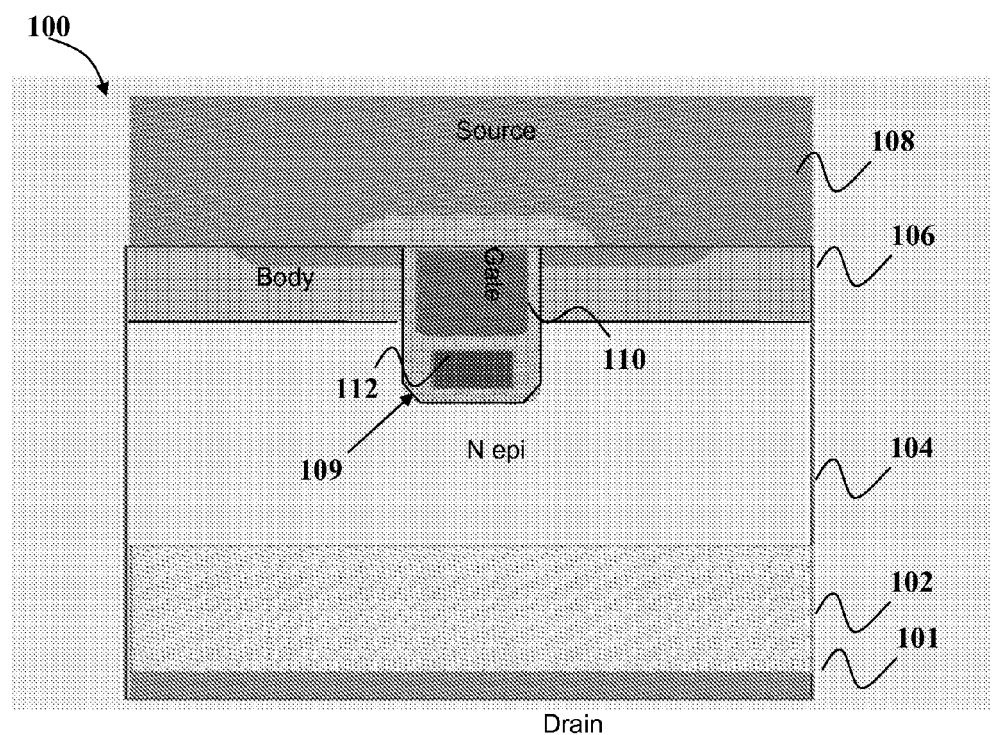
FIG. 1 is a cross-sectional view of a standard single gate trench-DMOSFET of the prior art.
Figure 2A:
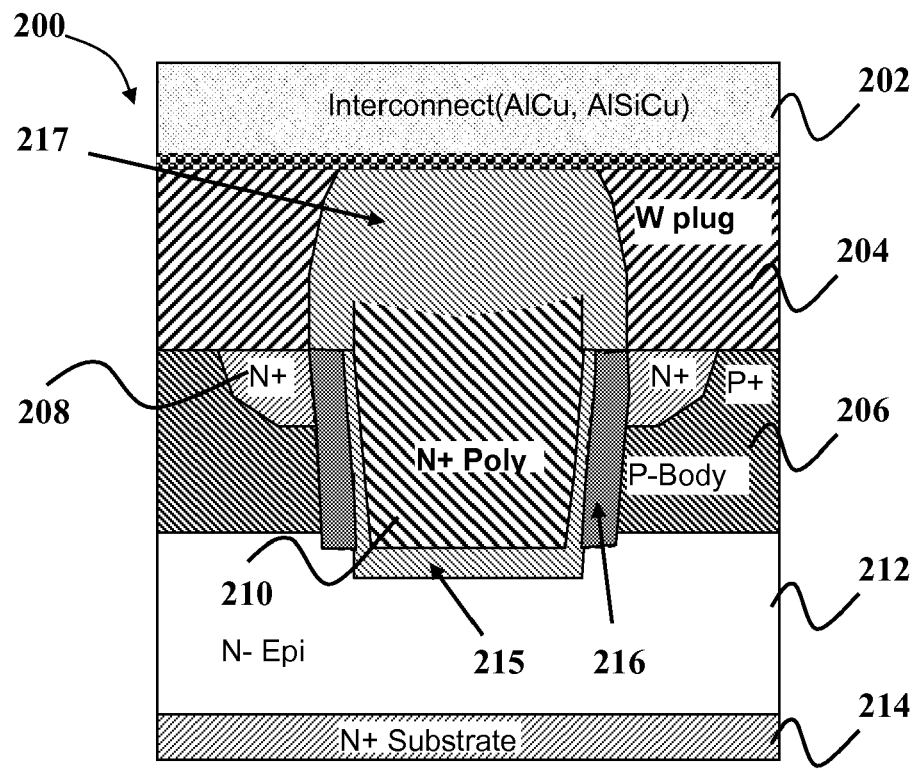
FIGS. 2A-2B are cross-sectional views of SiGe sidewall channel trench-DMOSFETs according to an embodiment of the present invention.
Figure 2B:
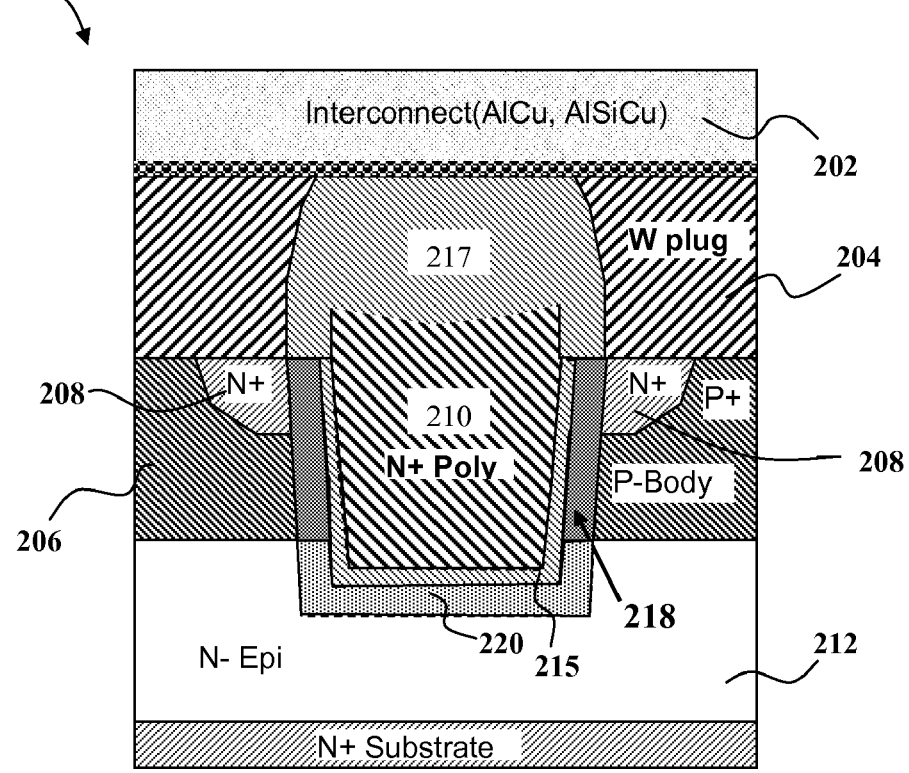

FIGS. 2A-2B are cross-sectional views of SiGe sidewall channel gate trench-DMOSFETs, having biaxial strain structure. According to embodiments of the present invention, a P-type SiGe layer may be selectively grown only on trench sidewalls. As shown in FIG. 2A, a SiGe sidewall channel gate trench-DMOSFET 200 may include a N+ substrate 214, upon which is grown a highly doped N-epitaxial layer 212 of a predetermined thickness that functions as drain region. Within the N-epi layer 212, a P-body region 206 (p, p+) is provided, e.g., by suitable doping. N+ type layers 208 functioning as source regions are provided on a surface region of the p-body region 206, e.g., by ion implantation. The DMOSFET 200 also includes a N+ polysilicon trench gate 210 insulated from the P-body layer 206 and source regions 208 by a gate oxide layer 215 and insulated from a metal (e.g., Tungsten) plug layer 204 by an oxide layer 217. A conductive layer 202 overlying most of the metal plug layer 204 serves as source, which can be made of Aluminum-Copper (AlCu) or Aluminum-Silicon-Copper (AlSiCu). A P-type SiGe layer 216 is selectively grown only on the trench sidewalls and on P-body layer 206.

The SiGe sidewall channel gate trench-DMOSFET 201 of FIG. 2B is similar to the SiGe sidewall channel gate trench-DMOSFET 200 of FIG. 2A, except that in the DMOSFET 201 of FIG. 2B, a P-type SiGe layer 218 is grown along the trench sidewalls on the P-body layer 206 and a N-type SiGe layer 220 is grown on the bottom of the trench between the gate oxide 215 and the N-epitaxial doped layer 212.

Figure 2C:
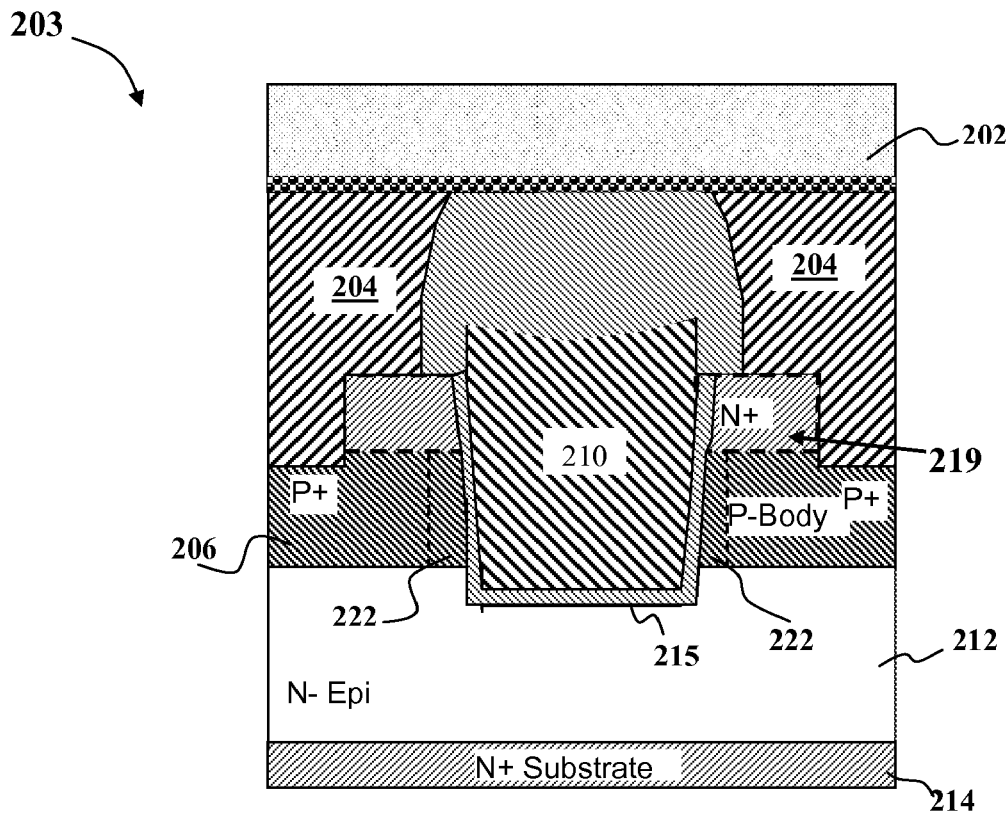
FIG. 2C is a cross-sectional view of a trench-DMOSFET having SiGe-source and a strained channel according to an embodiment of the present invention.

FIG. 2C is a cross-sectional view of a gate trench DMOSFET 203 according to an alternative embodiment of the present invention. The gate trench DMOSFET 203 uses a SiGe-source to produce a strained channel strained channel. The structure of the DMOSFET 203 is similar to that shown in FIG. 2A. In the DMOSFET 203, however, SiGe source regions 219 may be configured to induce a unidirectional uniaxial compressive strain structure within a silicon channel. Similar to the DMOSFET 200 of FIG. 2A, the DMOSFET 203 includes an N+ substrate 214, upon which is grown a lightly doped n-epitaxial layer 212 of a predetermined thickness functioning as drain region. Within the N-epi layer 212, P-body region 206 (p, p+) is provided. The DMOSFET 203 also includes a N+ poly trench gate 210 insulated from the P-body layer 206 and source regions 208 by a gate oxide layer 215 and insulated from metal plug layer 204 by an oxide layer 217. A conductive layer 202 e.g., made of AlCu or AlSiCu, overlying most of the W plug layer 204 serves as source. N+ type strained SiGe source regions 219 are provided on top of the P-body region 206. A lattice mismatch between the N+ SiGe and the P+ silicon material of the body layer 206 on the sides induces strain in a channel region 222 proximate the trench sidewalls. The strain in the channel region 222 increases mobility for charge carriers in the channel region.

Figure 2D:
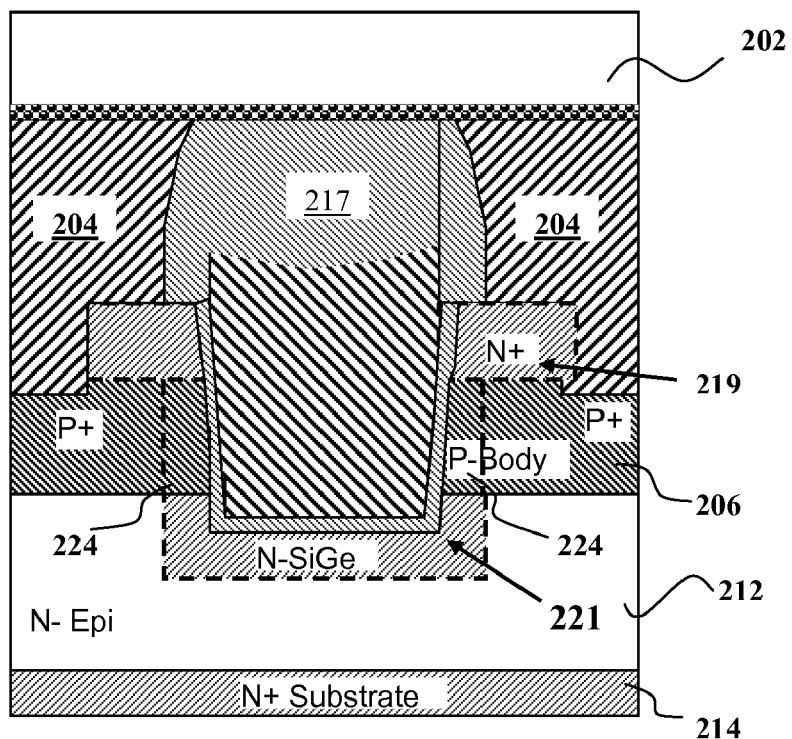
FIG. 2D is a cross-sectional view of a trench-DMOSFET having SiGe-source and drain and a strained channel according to an embodiment of the present invention.

FIG. 2D is a cross-sectional of a gate trench DMOSFET 205 having SiGe-source and drain regions to produce a strained channel according to another alternative embodiment of the present invention. The gate trench DMOSFET 205 induces unidirectional uniaxial compressive strain in a silicon channel region between source and drain regions formed with SiGe. As shown in FIG. 2D, DMOSFET 205 has a similar structure as the DMOSFET 203 of FIG. 2C. The DMOSFET 205 includes an N+ substrate 214, upon which is grown a lightly doped n-epitaxial layer 212 of a predetermined depth functioning as drain region. Within the N-epi layer 212, P-body region 206 (p, p+) is provided. The DMOSFET 203 also includes a N+ poly trench gate 210 insulated from the P-body layer 206 and source regions 208 by a gate oxide layer 215 and insulated from W plug layer 204 by an oxide layer 217. A conductive layer 202 (e.g., Al—Cu, Al—Si—Cu) overlying most of the W plug layer 204 serves as source. N+ type SiGe source regions 219 are provided on top of the P-body region 206. In addition, the DMOSFET 205 also includes an N-SiGe region 221 provided in the n-epitaxial layer 212 at the bottom of the gate trenches. Lattice mismatches between the N+ SiGe in the source region 219 and the N-SiGe region 221, at the bottom of the trench, and the P-body and P+ body contact silicon material of the body layer 206 on the sides induces strain in a uniaxial compression strain in the channel region 224 proximate the trench sidewalls. The strain in the channel region 224 increases mobility for charge carriers in the channel region.

Figure 3A:
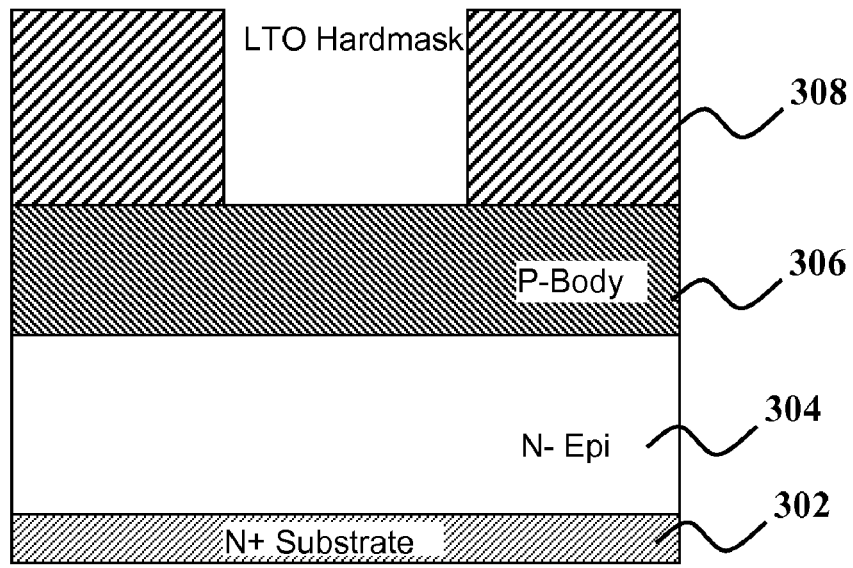
FIGS. 3A-3F are cross-sectional views illustrating a method of fabrication of SiGe sidewall channel trench-gate DMOSFETs of the types depicted in FIGS. 2A-2B.

FIGS. 3A-3F are cross-sectional views illustrating a method of fabrication of vertical channel trench-gate DMOSFETs of the types depicted in FIGS. 2A-2B. As shown in FIG. 3A, an N-type epitaxial semiconductor layer 304 may be grown on a substrate 302. By way of example, the substrate 302 may be single crystal silicon material. The N-type epitaxial (N-epi) semiconductor layer 304 may be formed by an epitaxial growth method on a major surface of the N+ substrate 302. A protective oxide layer may be formed on an exposed surface of the substrate 302, e.g., using local oxidation of silicon (LOCOS). Then, P-type dopants are blanket implanted (or optionally implanted in a pattern) and diffused in a surface region of the N-epi semiconductor layer 304, thereby forming a P-type semiconductor layer 306 that forms a body region of the MOSFET. An etching mask 308 is then formed on a surface of the P-body layer 306, e.g., by a low temperature oxide (LTO) deposition, photoresist patterning and oxide etching technique.

Figure 3B:
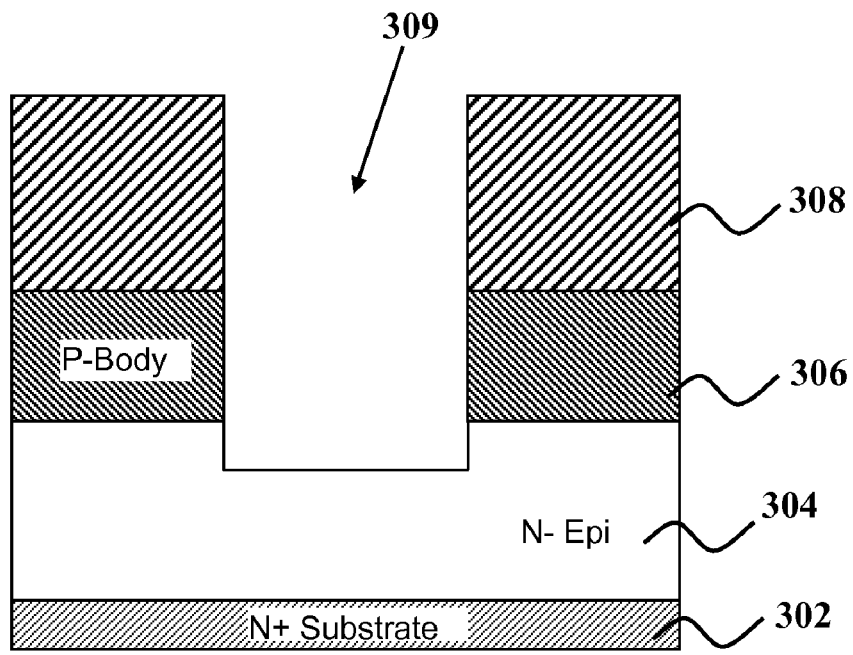

As shown in FIG. 3B, a trench 309 is then formed by reactive ion etching (RIE) using mask 308. The trench 309 penetrates through the P-body layer 306 such that the bottom of the trench 309 reaches into the N-epi layer 304. Etched polymer may then be stripped and wafer cleaned at this point.

Figure 3C:
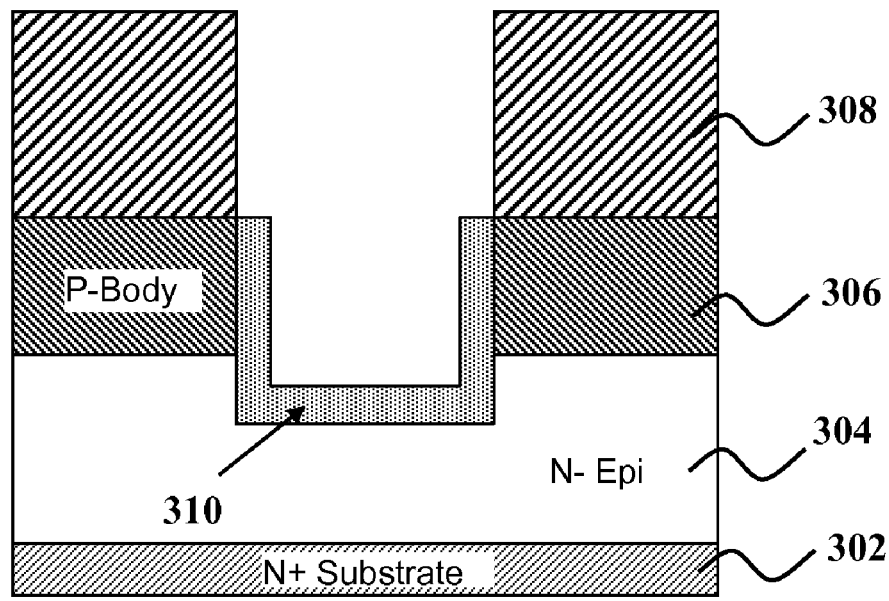

As shown in FIG. 3C, an undoped SiGe layer 310 is formed in the trench 309. The deposition of the undoped SiGe layer 310 may be performed using blanket deposition in which e.g., poly-SiGe is deposited on the oxide 308 and crystalline-SiGe grown on the Silicon of the P-body layer 306 and N-epi layer 304. Alternatively a selective growth technique may be used to form a layer of SiGe on the P-body layer 306 and N-epi layer 304, without any deposition on the surface of the oxide 308.

Figure 3D:
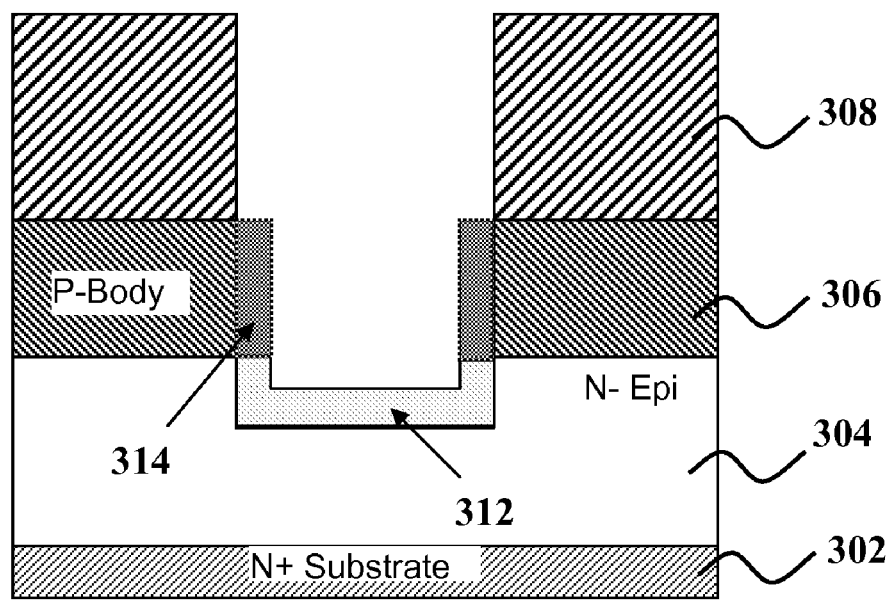

As shown in FIG. 3D, bottom N-SiGe region 312 is formed by N-type dopant implantation and the sidewall SiGe doped region 314 is formed by body diffusion, such that P-type dopants diffuse from the P-body region 306 into a region of the SiGe layer 310 proximate the P-body layer 306 and, N-type dopants diffuse from the N-epi layer 304 into a region of the SiGe layer 310 proximate the N-epi layer 304.

Figure 3E:
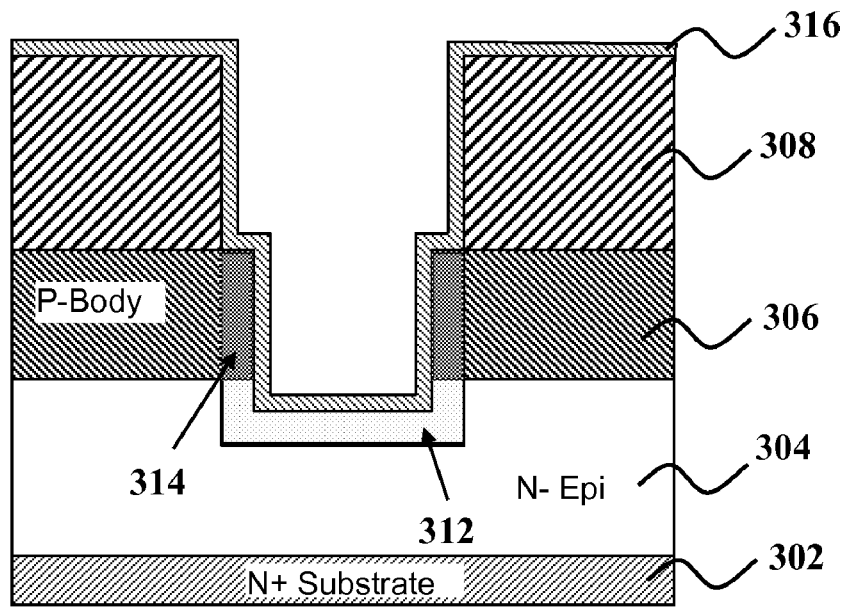
Figure 3F:
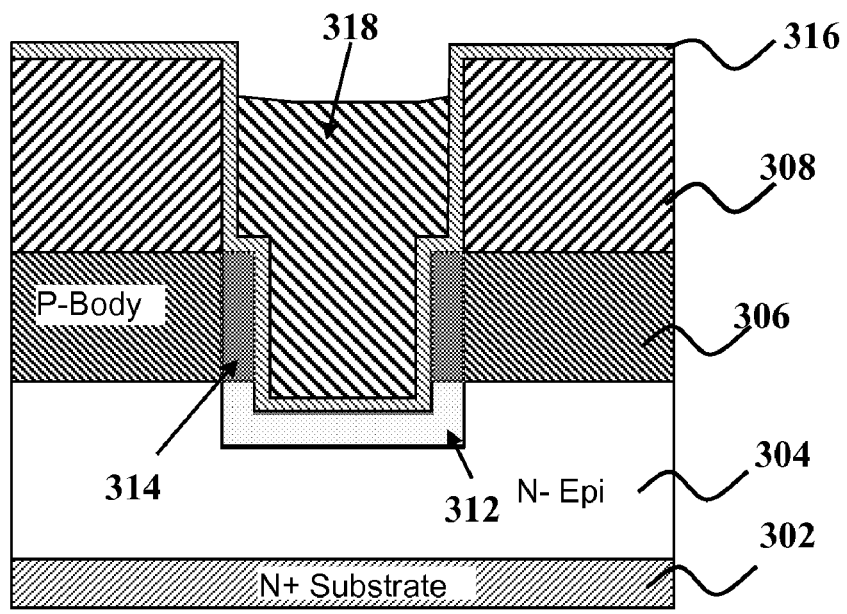

A gate oxide layer 316 is deposited on the sidewall of the trench as shown in FIG. 3E, followed by a deposition and etch back of a polysilicon gate electrode material and interconnect 318 as shown in FIG. 3F. The device of the type depicted in FIGS. 2A-2B may then be completed with ion implantation to produce source regions similar to the source regions 208 of FIG. 2B.

Figure 4A:
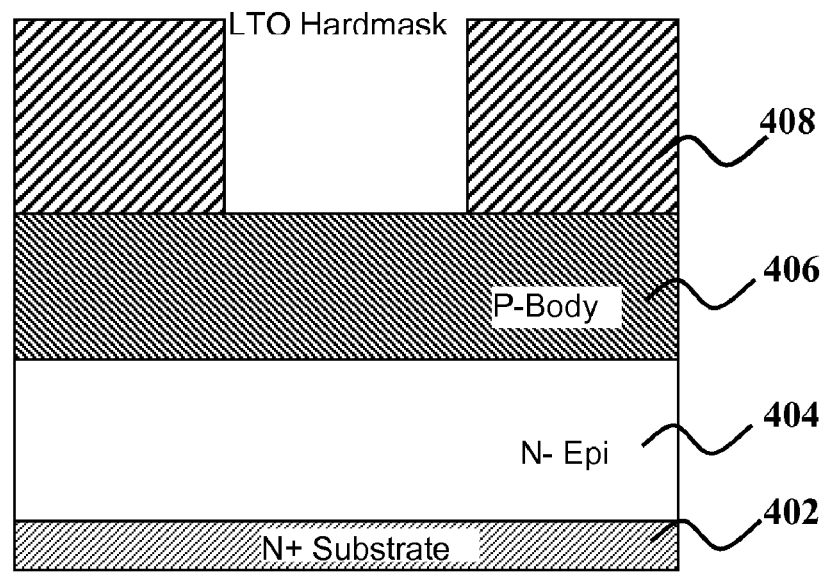
FIGS. 4A-4J are cross-sectional views illustrating a method of fabrication of P-type SiGe sidewall channel trench-gate DMOSFETs of the types depicted in FIGS. 2A-2B.

FIGS. 4A-4J are cross-sectional views illustrating a method of fabrication of P-type SiGe sidewall channel trench-gate DMOSFETs of the types depicted in FIGS. 2A-2B. As shown in FIG. 4A, an N-type epitaxial semiconductor layer 404 may be grown on a substrate 402. By way of example, the substrate 402 may be N+++ highly doped N-type crystalline silicon. The N-type epitaxial (N-epi) semiconductor layer 404 may be formed by any suitable epitaxial growth method on a major surface of the N+ substrate 402. A protective oxide layer may be formed on an exposed surface of the substrate 402, e.g., using local oxidation of silicon (LOCOS). Then, P-type dopants are blanket implanted and diffused in a surface region of the N-epi semiconductor layer 404, thereby forming a P-type semiconductor layer 406. An etching mask 408 is formed on a surface of the P-body layer 406, e.g., by a low temperature oxide (LTO) deposition, photoresist patterning, and dry etching of oxide techniques.

Figure 4B:
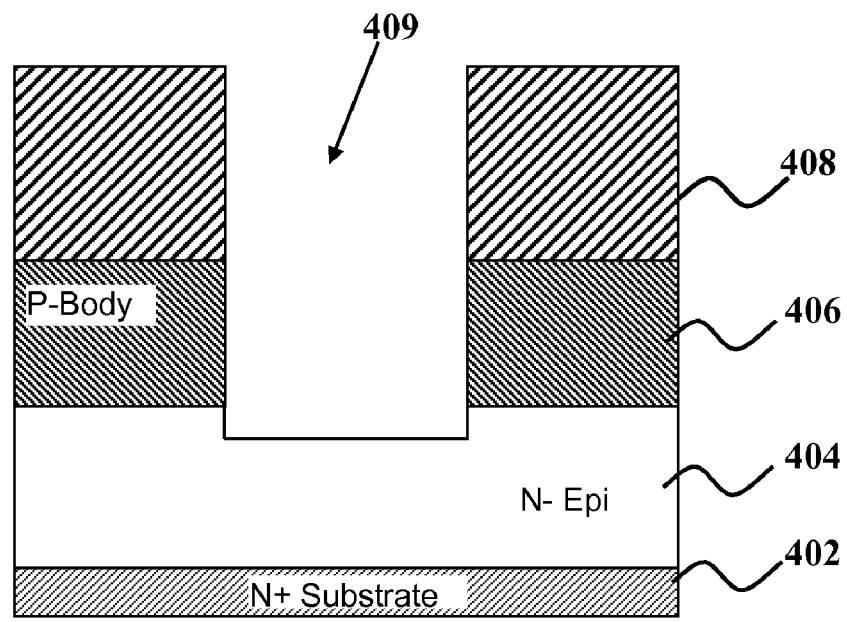
Figure 4C:
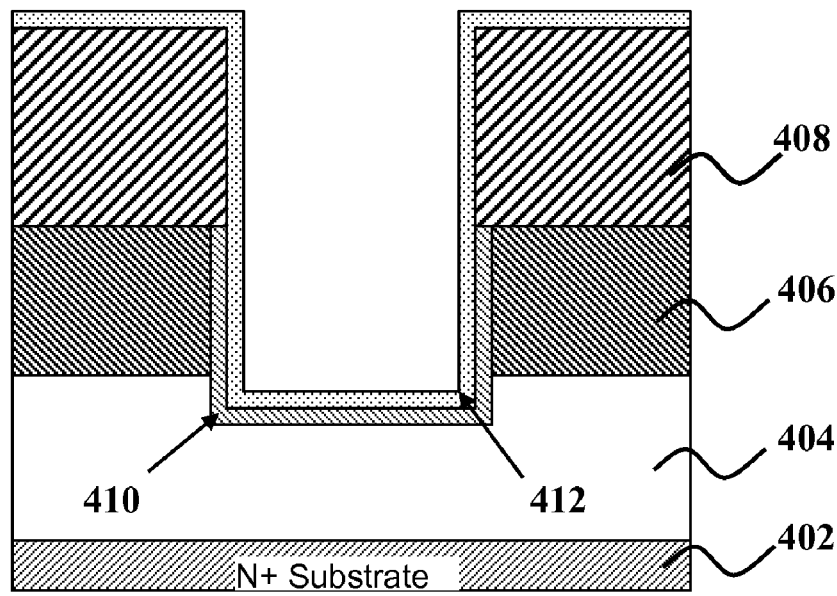
Figure 4D:
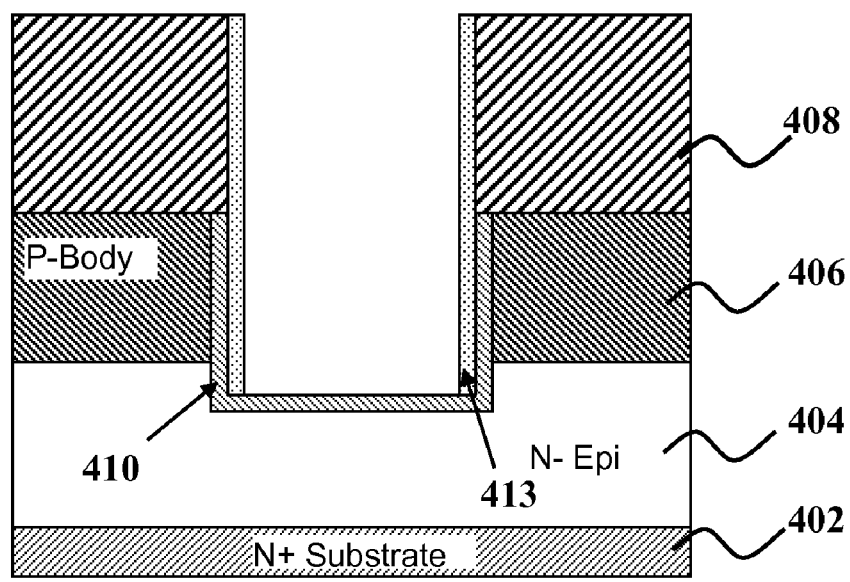

As shown in FIG. 4B, a trench 409 are formed by reactive ion etching (RIE) using mask 408. The trench 409 penetrates into the P-body layer 406 such that the bottom of the trench 409 reaches the N-epi layer 404. Etched polymer may be stripped and wafer may then be cleaned at this point. As shown in FIG. 4C, a thin pad oxide layer 410 may be selectively grown on the wall of the trench 409 only on the silicon of the P-body layer 406 and N-epi layer 404. A nitride layer 412 is then deposited on the thin pad oxide layer 410 and also on the mask 408. The nitride layer 412 may then be etched to form a nitride spacer 413 on the side walls of the trench as shown in FIG. 4D.

Figure 4E:
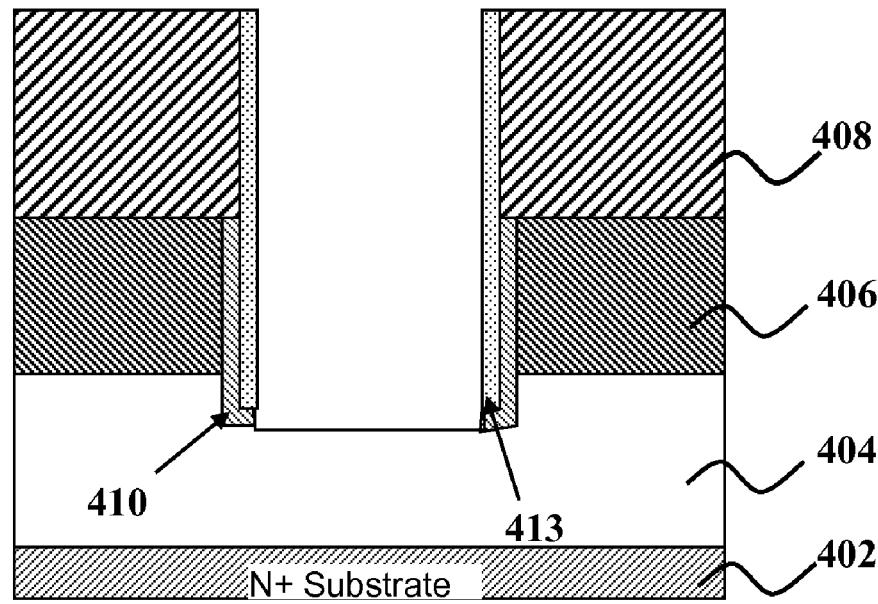
Figure 4F:
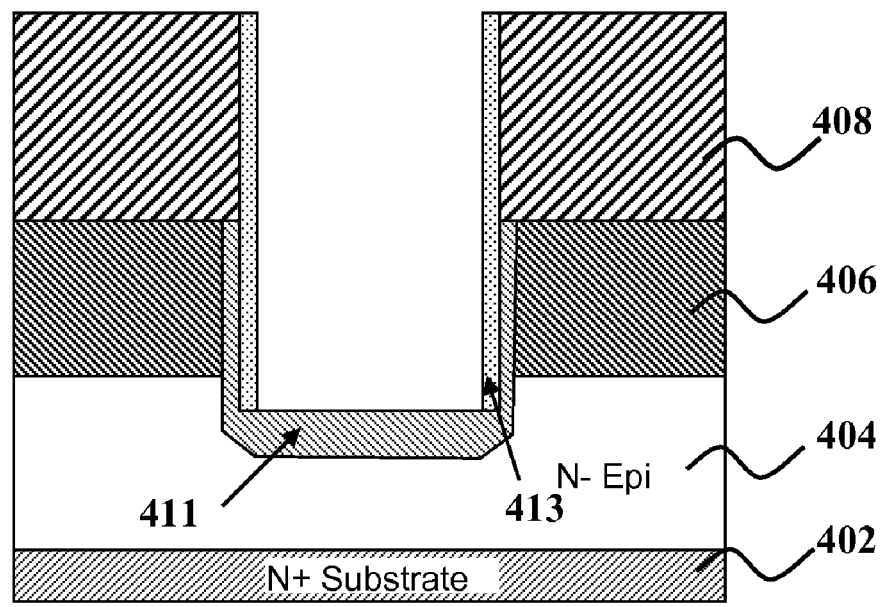
Figure 4G:
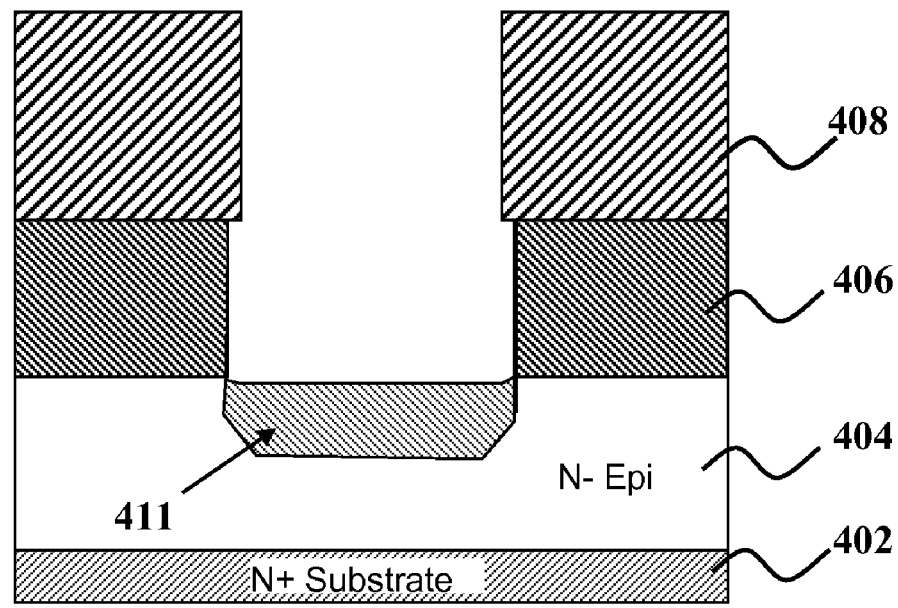
Figure 4H:
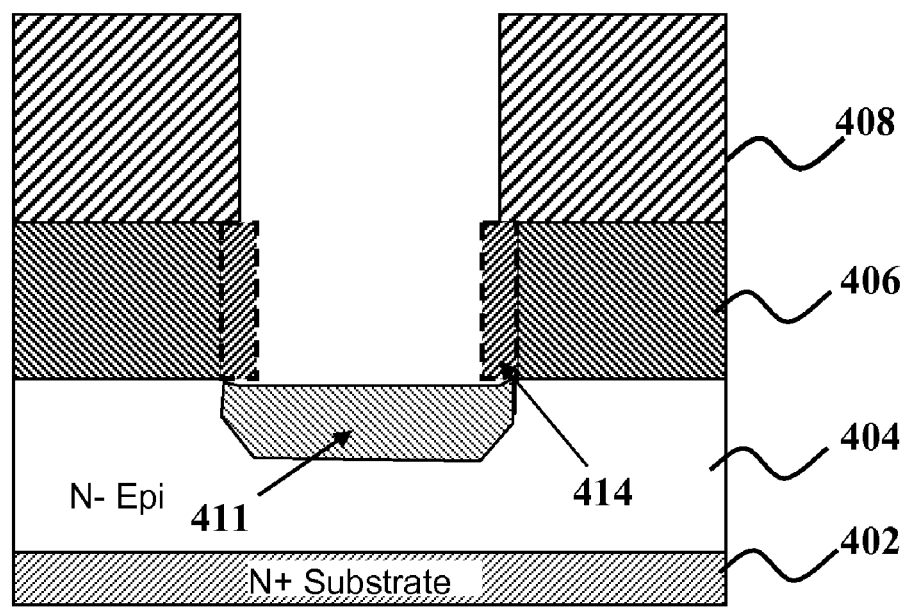

As shown in FIG. 4E, the thin pad oxide layer 410 is shortly etched followed by a short etching of the underlying N-epi layer 404. A thick oxide layer 411 is formed in the etched regions of the N-epi layer 404, e.g., by thermal oxidation as shown in 4F. As shown in FIG. 4G, the nitride spacer 413 is first stripped followed by the etching of the thin pad oxide 410. A P-SiGe layer 414 is then selectively grown on the exposed silicon on the trench sidewalls of the P-body layer 406 as shown in FIG. 4H.

Figure 4I:
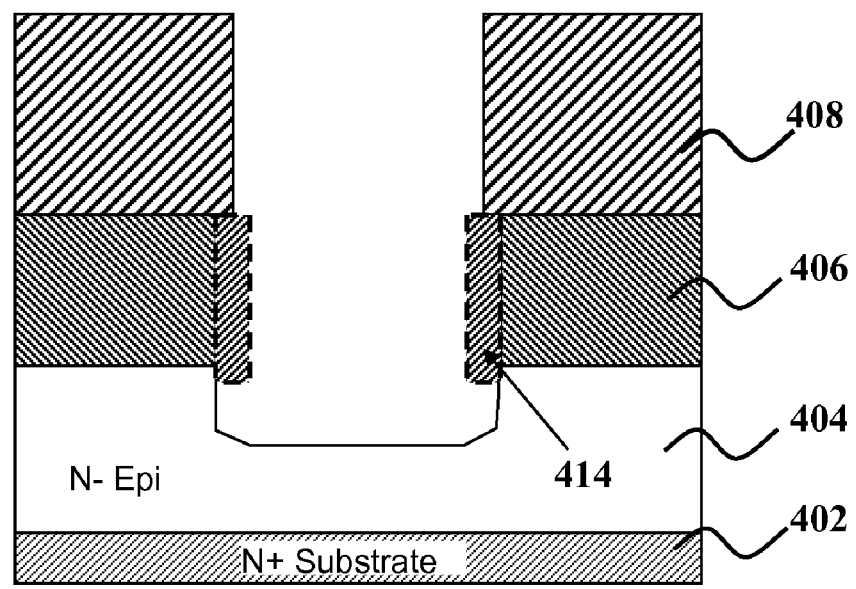
Figure 4J:
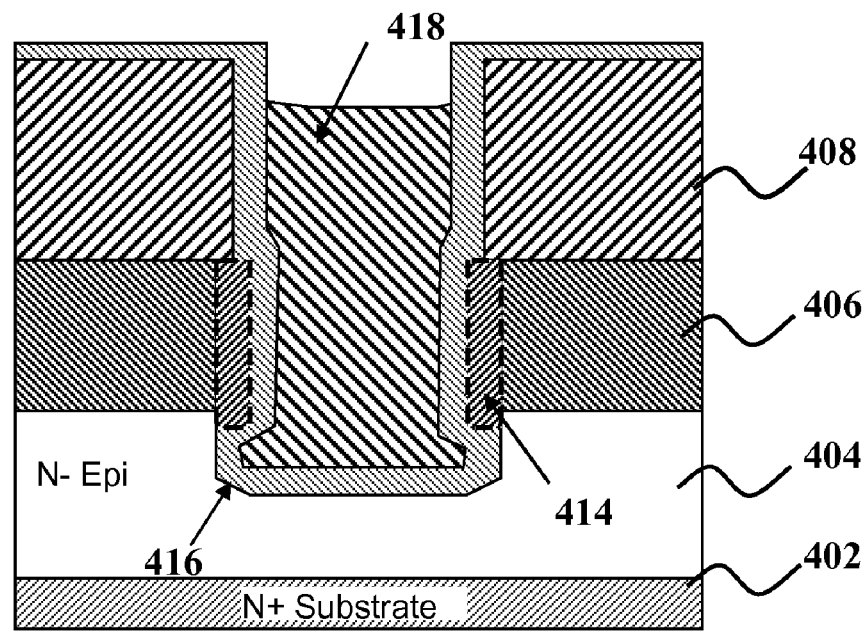

The thick oxide layer 411 is then removed as shown in FIG. 4I. A gate oxide layer 416 is then deposited on the sidewalls of the trench 409 and the top surface of the mask 408, e.g., by high temperature oxide deposition technique (HTO). A Polysilicon gate 418 (which may be, e.g., in-situ doped N+ for example) is then deposited into the trench 409 followed with etching back as shown in FIG. 4J. The device may be completed, e.g., with ion implantation to form source regions, contact formation, metallization, and the like.

Figure 5A:
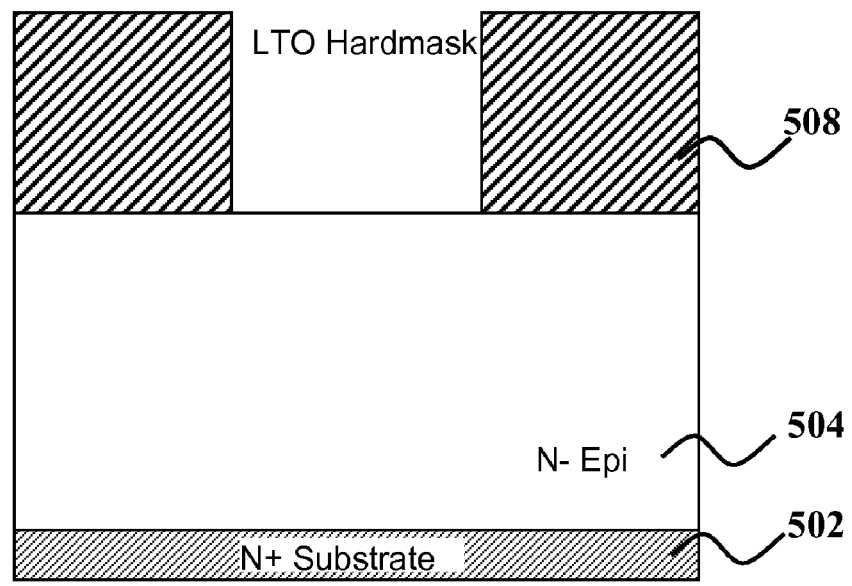
FIGS. 5A-5I are cross-sectional views illustrating a method of fabrication of uniaxial compressive strain trench-gate DMOSFETs of the type depicted in FIG. 2C.
Figure 5B:
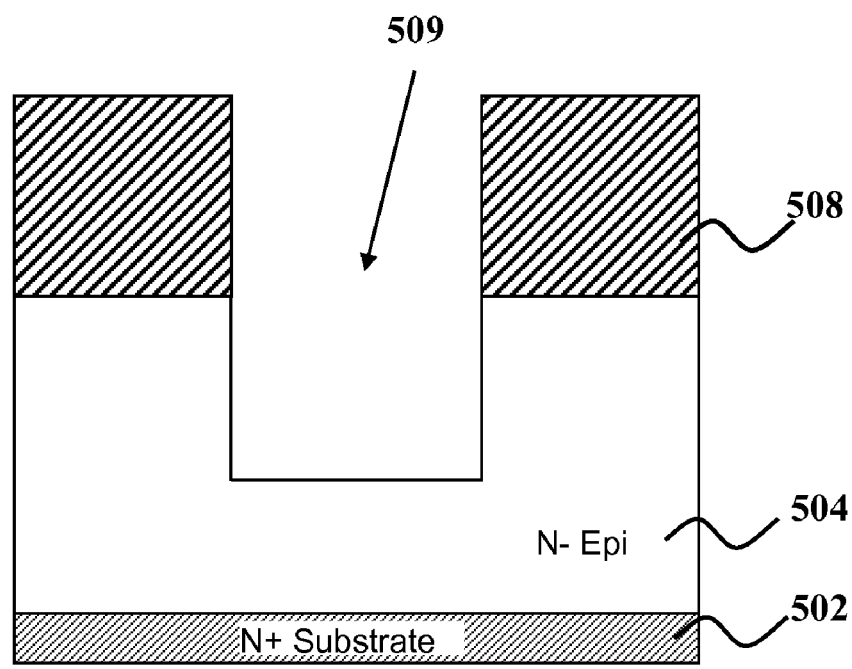

FIGS. 5A-5I are cross-sectional views illustrating a method of fabrication of uniaxial compressive strain trench-gate DMOSFETs of the type depicted in FIG. 2C. As shown in FIG. 5A, an N-type epitaxial semiconductor layer 504 may be formed on a major surface of a substrate 502. By way of example, the substrate 502 may be single crystal silicon, highly N-type doped. The N-type epitaxial (N-epi) semiconductor layer 504 may be formed by any suitable epitaxial growth method on a major surface of the N+ substrate 502. A protective oxide layer may be formed on an exposed surface of the substrate 502, e.g., using local oxidation of silicon (LOCOS). An etching mask 508 is then formed on a surface of the N-epi layer 504 by a low temperature oxide (LTO) deposition technique. As shown in FIG. 5B, a trench 509 is formed in the N-epi layer 504, e.g., by reactive ion etching (RIE) using mask 508. The trench 509 is penetrates partly into the N-epi layer 504 such that the bottom of the trench 509 reaches about one half the depth of the N-epi layer 504.

Figure 5C:
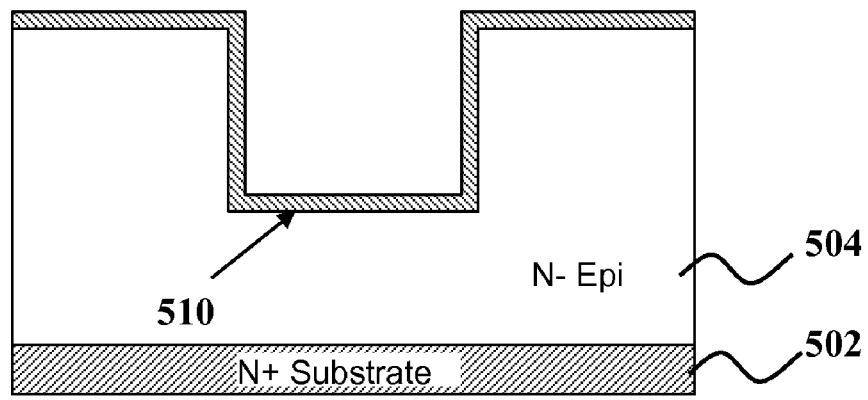
Figure 5D:
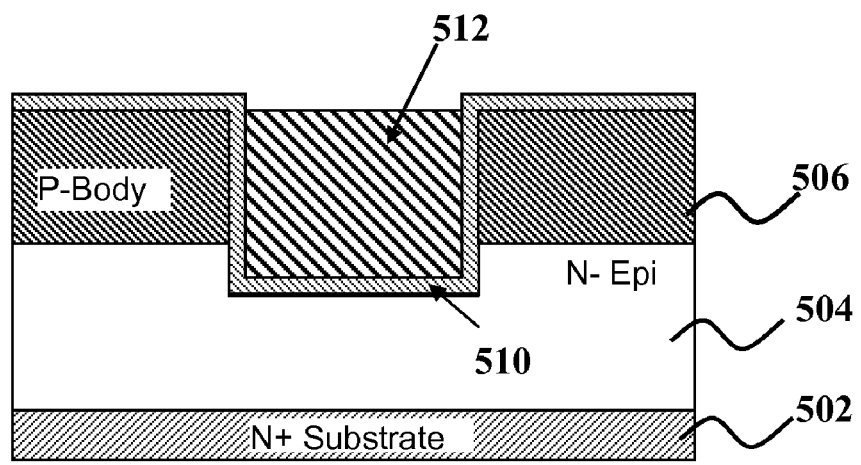

As shown in FIGS. 5C, the mask 508 is removed and a gate oxide layer 510 is grown on the inside of the trench 509 after a sacrificial (SAC) oxidation is carried out and etched off from the inside of the trench 509 to remove etching damage to the silicon substrate. Part of the gate oxide layer 510 may cover exposed portions of the epitaxial layer 504. Polysilicon may be deposited into the trench 509, doped N+, and etched back to form a gate 512 as shown in FIG. 5D. P-type dopants may then be blanket implanted and diffused into a surface region of the N-epi semiconductor layer 504, thereby forming a P-type semiconductor layer 506.

Figure 5E:
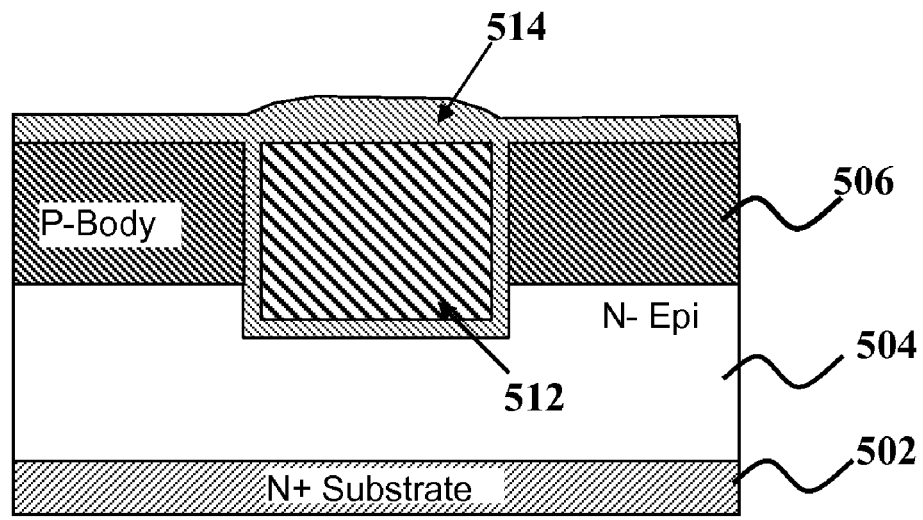
Figure 5F:
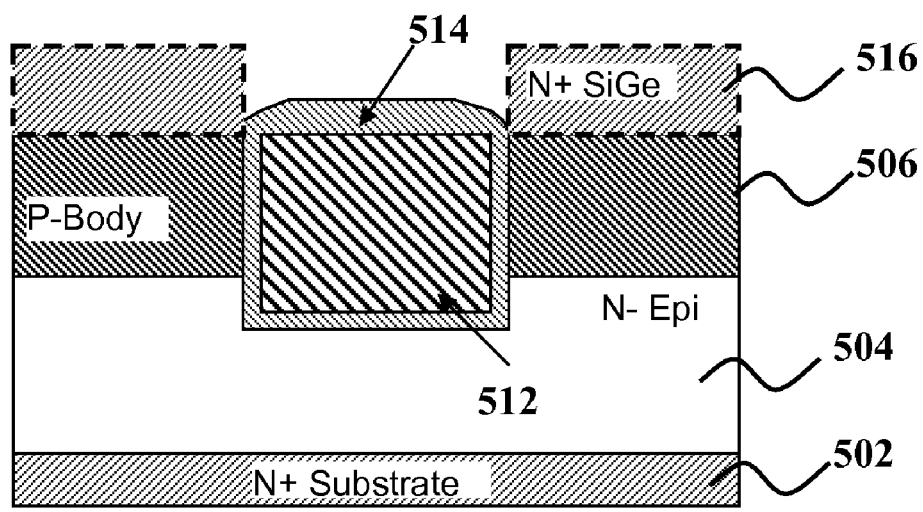

As shown in FIGS. 5E, a thick oxide layer 514 may be formed over the N+ doped poly gate 512 (because oxide grows at a much faster rate on N+ doped region than low doped regions) and a thinner oxide over the exposed upper surface of the P-type semiconductor layer 506 (because the doping is less in the P-body regions). The gate oxide layer 510 on top of the P-body layer 506 may then be etched back to expose the upper surface of the P-type semiconductor layer 506. N+ SiGe layers 516 may then be selectively grown on the exposed upper surface of the P-body layer 506 as shown in FIG. 5F.

Figure 5G:
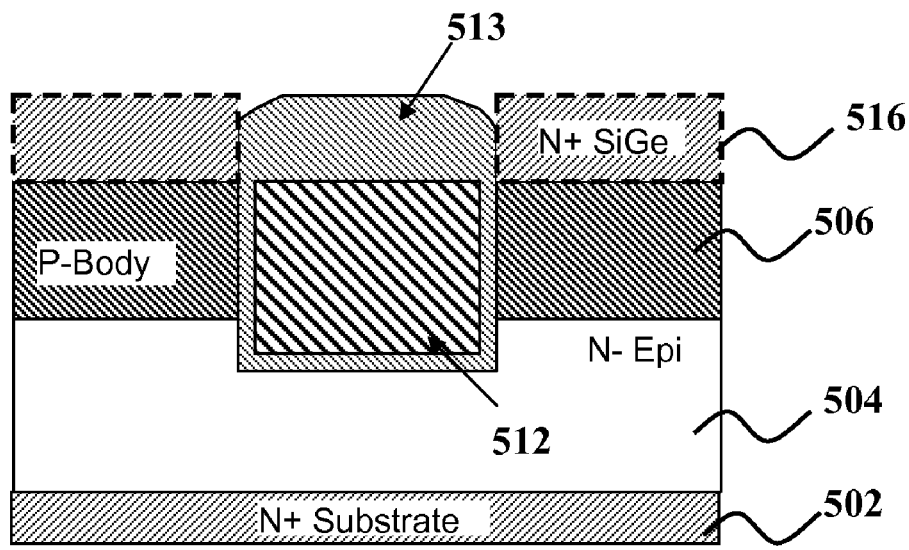
Figure 5H:
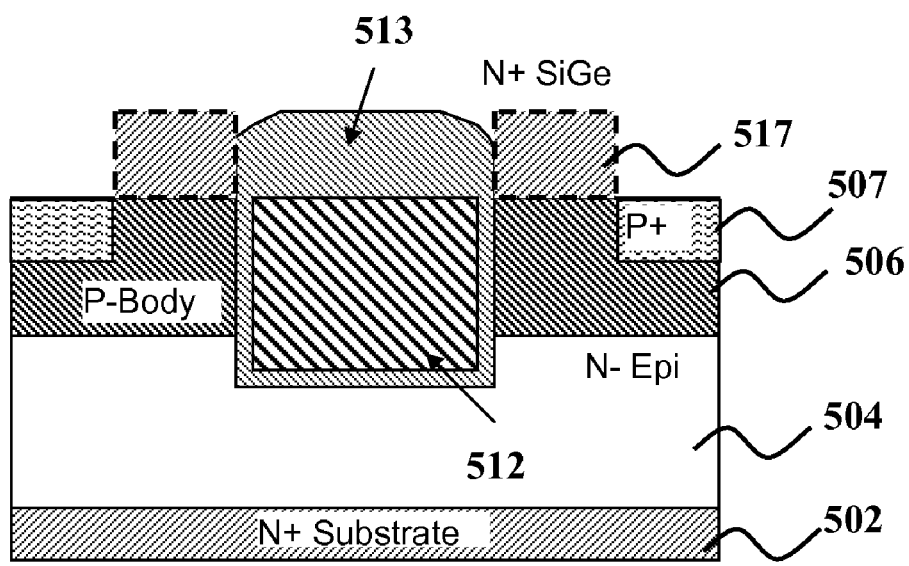
Figure 5I:
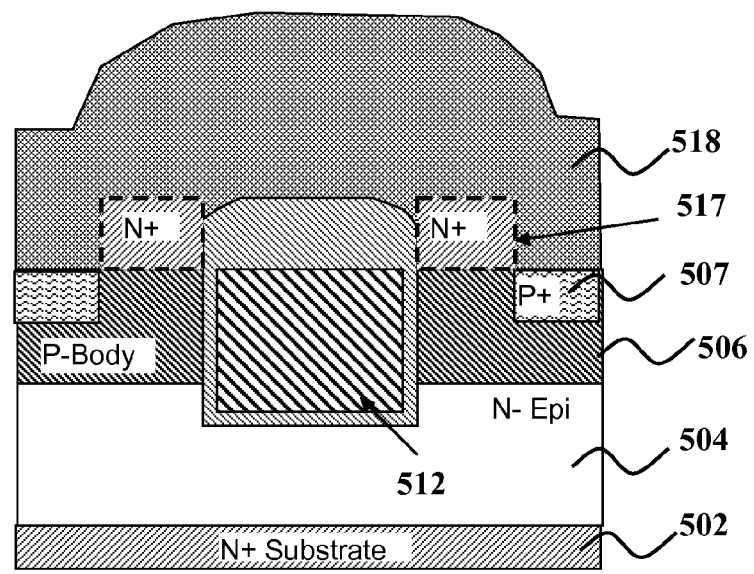

As shown in FIG. 5G, the thick oxide layer 514 may optionally be passivated to produce a passivated oxide layer 513 over the gate 512. This can be achieved by depositing a dielectric (LTO oxide for example) and etching back (blanket RIE or CMP) to expose the N+ SiGe source regions. The N+ SiGe layers 516 may then be patterned and etched down to the body as shown in FIG. 5H to produce N+ SiGe source regions 517 and a body contact 507. Portions of the p-body layer 506 may optionally be doped with P+ dopants to form a body contact 507. Such doping may be accomplished, e.g., using a shallow implantation with $BF_2$ through a body contact mask, which may then be stripped. Source metal 518 may then be formed over the passivated oxide 513 and N+ SiGe source regions 517 to complete the device as shown in FIG. 5I.

Figure 6A:
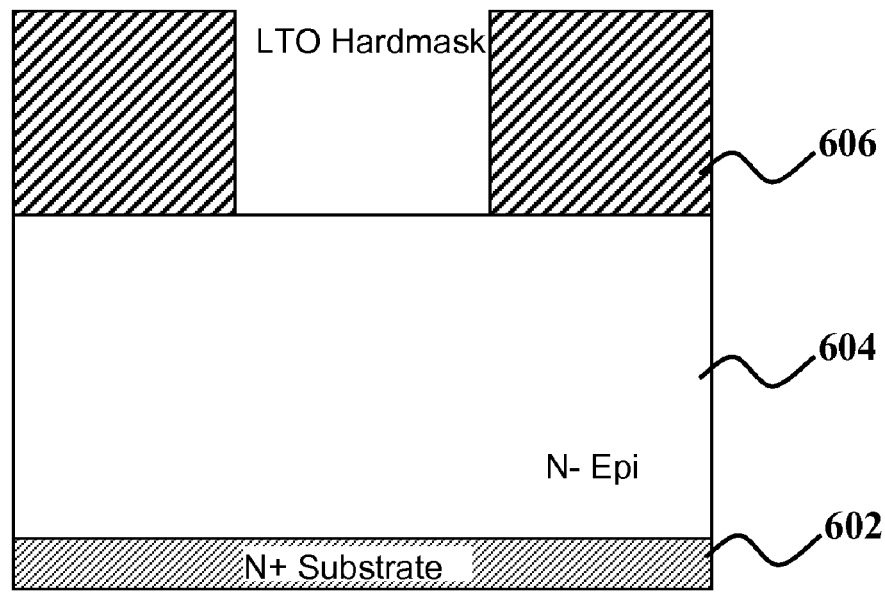
FIGS. 6A-6H are cross-sectional views illustrating an alternative method of fabrication of uniaxial compressive strain trench-gate DMOSFETs of the type depicted in FIG. 2C.

FIGS. 6A-6H illustrate an alternative method of fabrication of uniaxial compressive strain trench-gate DMOSFETs of the type depicted in FIG. 2C. As shown in FIG. 6A, an N-type epitaxial (N-epi) semiconductor layer 604 may be formed on a major surface of a substrate 602. By way of example, the substrate 602 may be single crystal silicon, highly N-type doped. The N-type epitaxial (N-epi) semiconductor layer 604 may be formed by any suitable epitaxial growth method on a major surface of the N+ substrate 602. A hardmask layer 606 may be formed on an exposed surface of the N-epi layer 604, e.g., using low temperature oxidation (LTO).

Figure 6B:
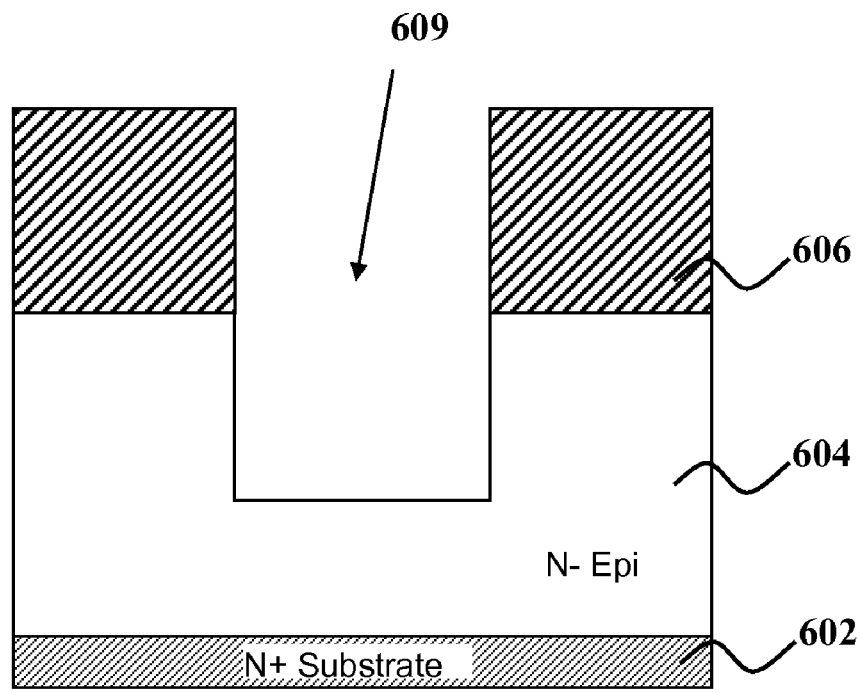
Figure 6C:
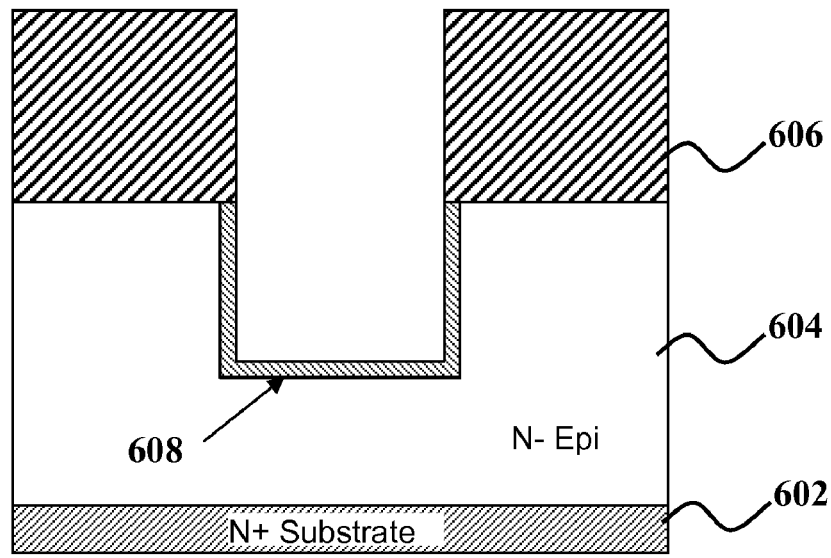
Figure 6D:
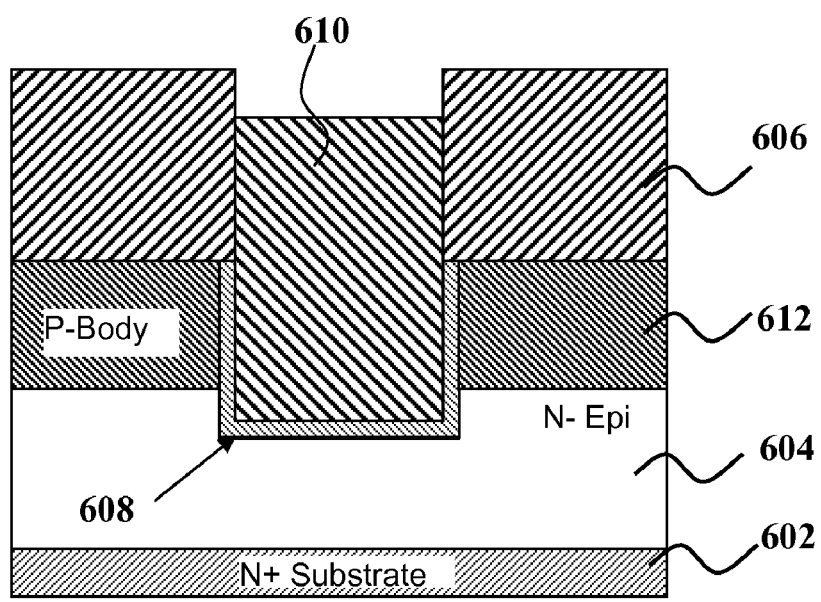

As shown in FIG. 6B, a trench 609 may be formed in the N-epi layer 604, e.g., by reactive ion etching (RIE) through openings in the hardmask layer 606. The trench 609 may penetrate partway through the N-epi layer 604, e.g., such that the bottom of the trench 609 reaches predetermined depth of the N-epi layer 604. As shown in FIG. 6C, a gate oxide layer 608 may be grown on the inside of the trench 609 after a sacrificial oxidation and strip is carried out on the inside walls and bottom of the trench 609. Polysilicon, preferably N+ doped poly, is deposited into the trench 609 and etched back to form gate 610. P-type dopants may then be blanket implanted and diffused through the mask 606 into a surface region of the N-epi semiconductor layer 604, thereby forming a P-type semiconductor layer 612.

Figure 6E:
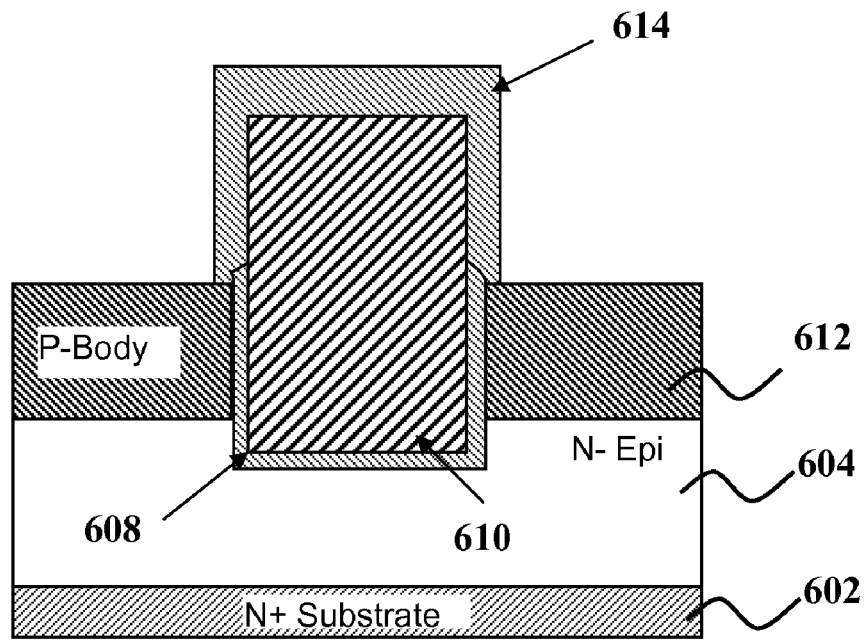
Figure 6F:
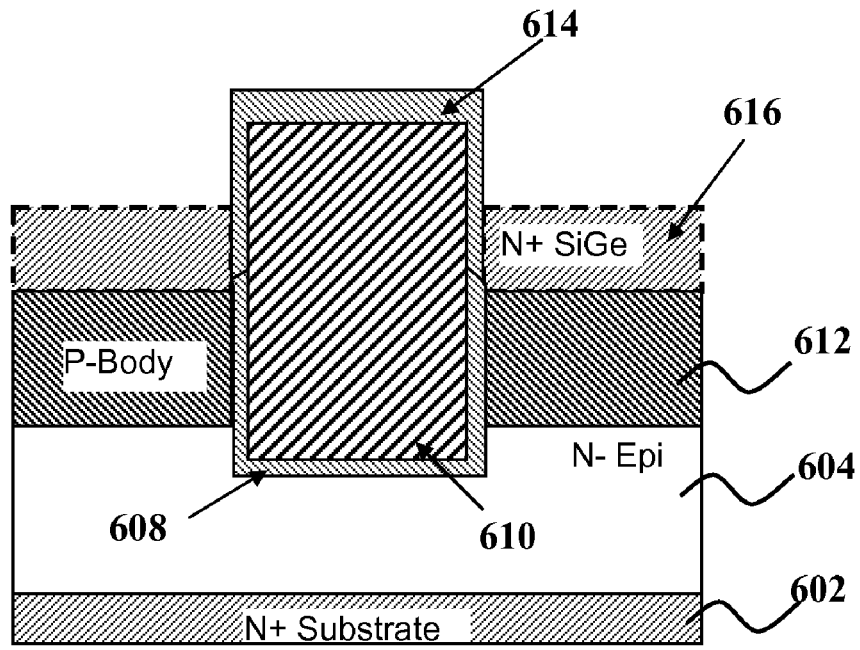

In FIG. 6E, a thick oxide layer 614 may then be formed over the highly doped poly gate 610 (since oxide grows faster on highly doped N+ silicon or polysilicon, than P-type or low-doped N-type surfaces). The thick oxide layer 614 may be slightly etched to form a thinner layer and expose the N-epi surfaces away from the Gate regions. N+ SiGe layers 616 are selectively grown on the exposed P-body layer 612 after then thin oxide etch, as shown in FIG. 6F.

Figure 6G:
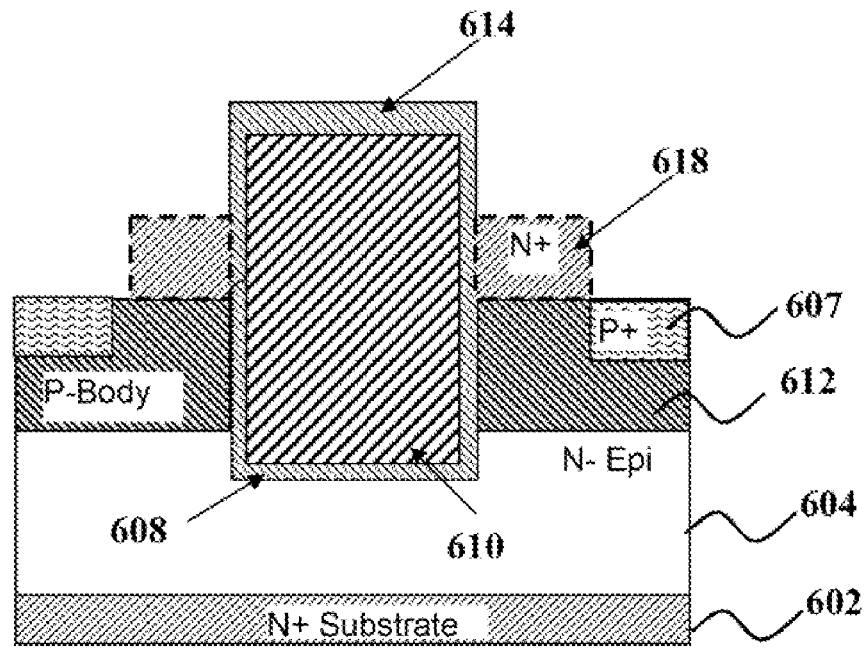
Figure 6H:
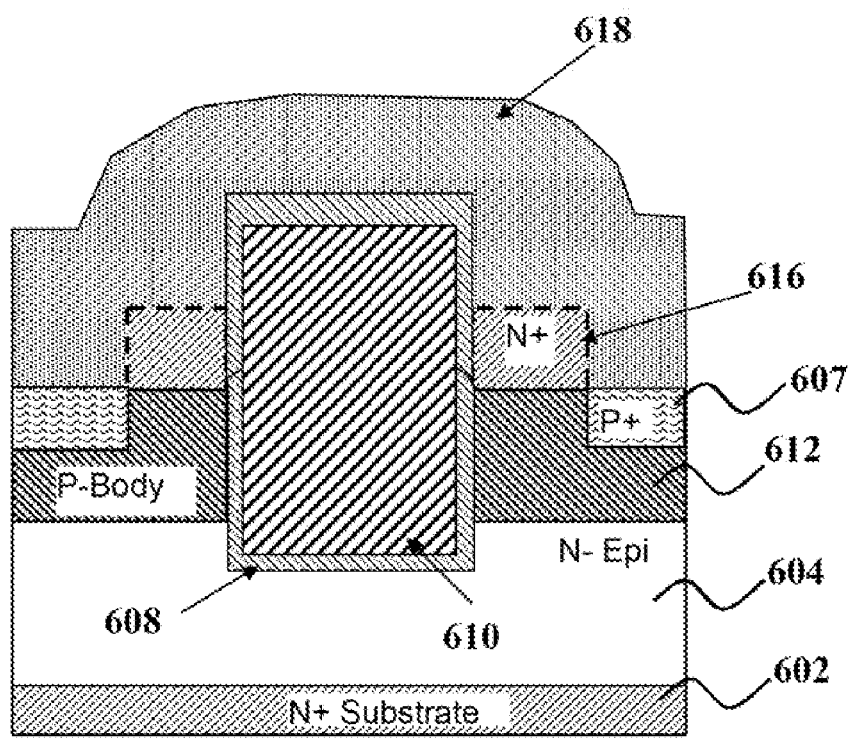

As shown in FIG. 6G, the SiGe layers 616 may be selectively etched back to form source regions 618. A body contact mask may be provided to protect the N+ source regions 616 from an etching process and the N+ SiGe layers 616 are etched. The p-body layer 612 may optionally be implanted with P+ dopants to form a body contact 607. By way of example, the P-body layer 612 may be selectively shallow implanted with $BF_2$. The body contact mask may then be stripped. Source metal 618 is formed to complete the device as shown in FIG. 6H.

Figure 7A:
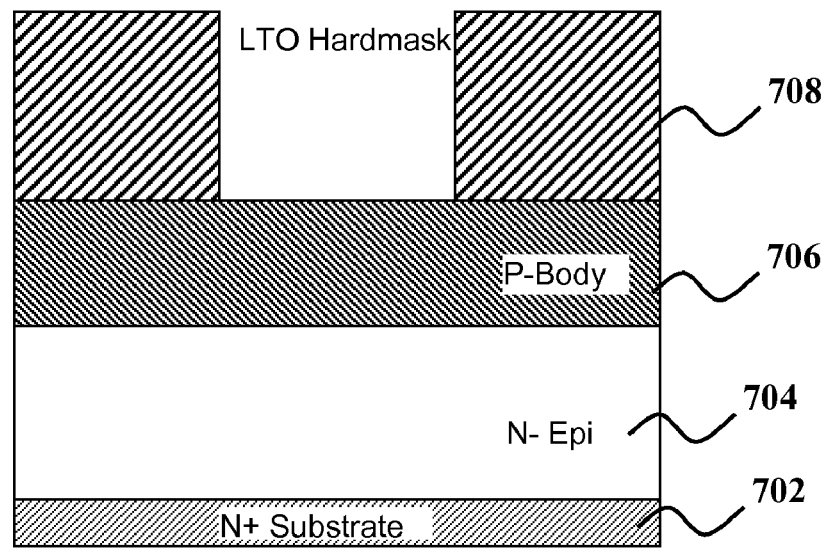
FIGS. 7A-7F are cross-sectional views illustrating a method of fabrication of unidirectional uniaxial compressive strain trench-gate DMOSFETs of the type depicted in FIG. 2D.

FIGS. 7A-7F illustrate an example of a method of fabrication of a unidirectional uniaxial compressive strain trench-gate DMOSFETs of the type depicted in FIG. 2D. As shown in FIG. 7A, an N-type epitaxial (N-epi) semiconductor layer 704 may be formed on a major surface of a substrate 702. By way of example, the substrate 702 may be single crystal silicon highly N-type doped. The N-type epitaxial (N-epi) semiconductor layer 704 may be formed by any suitable epitaxial growth method on a major surface of the N+ substrate 702.

Then, P-type dopants are blanket implanted and diffused in a surface region of the N-epi semiconductor layer 704, thereby forming a P-type semiconductor layer 706. A hardmask layer 708 may be formed on an exposed surface of the N-epi layer 706, e.g., using low temperature oxidation (LTO).

Figure 7B:
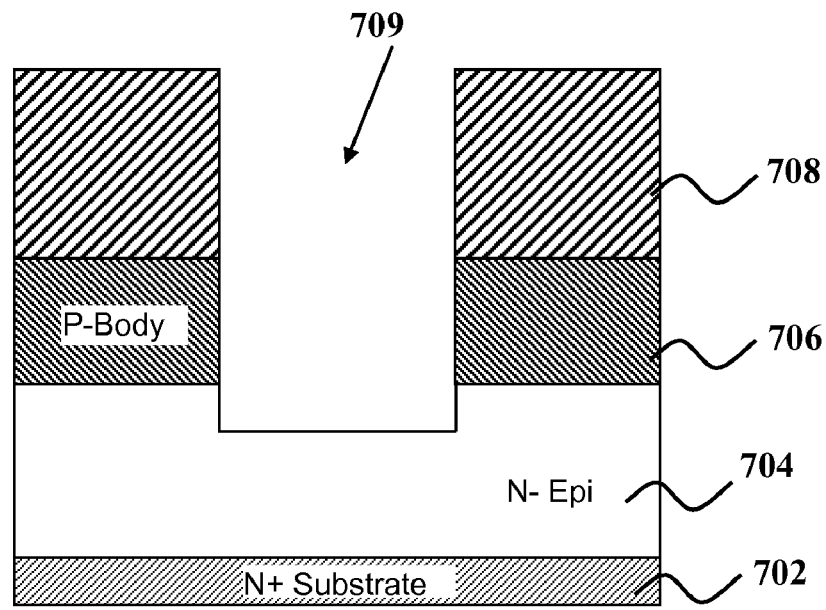

As shown in FIG. 7B, a trench 709 may be formed, e.g., by reactive ion etching (RIE) through one or more openings in the mask 708. The trench 709 may penetrate through the P-body layer 706 such that the bottom of the trench 709 reaches the N-epi layer 704.

Figure 7C:
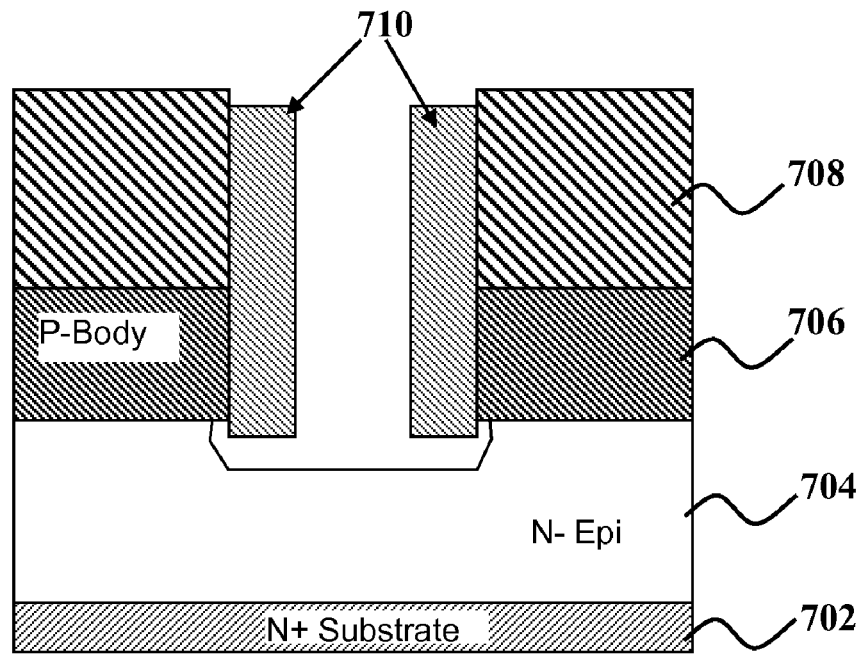
Figure 7D:
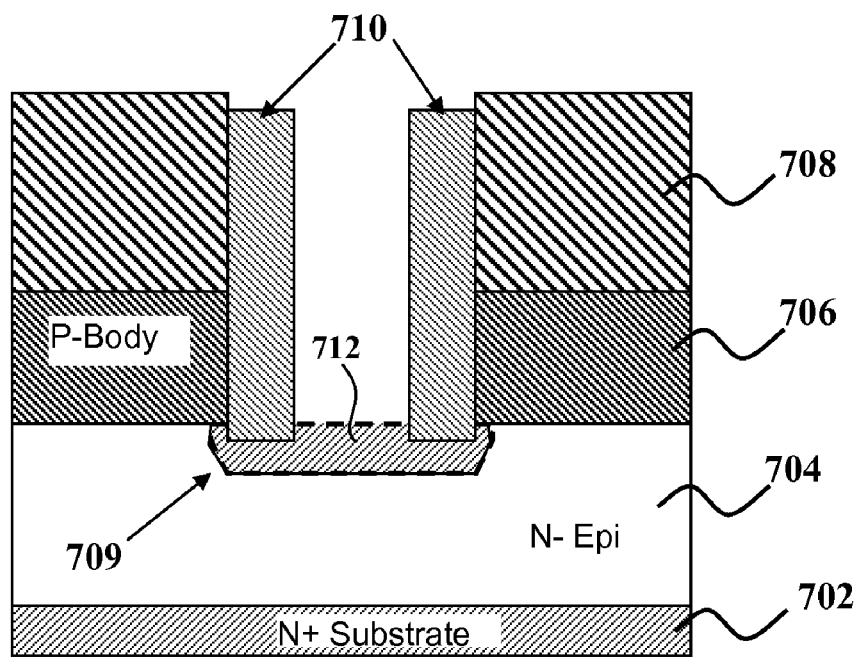

As shown in FIG. 7C, oxide spacers 710 may be formed on the sidewall of the trench 709. Silicon of the N-epi layer 704 at the bottom of the trench 709 may be slightly isotropically etched to undercut the spacers 710. A N-SiGe layer 712 may then be selectively grown at the bottom of the trench 709 in the etched area of the N-epi layer 704, e.g., by Low-pressure chemical vapor deposition (LPCVD) as shown in FIG. 7D. The SiGe 712 may be grown on the exposed silicon surface, even under the oxide spacers 710.

Figure 7E:
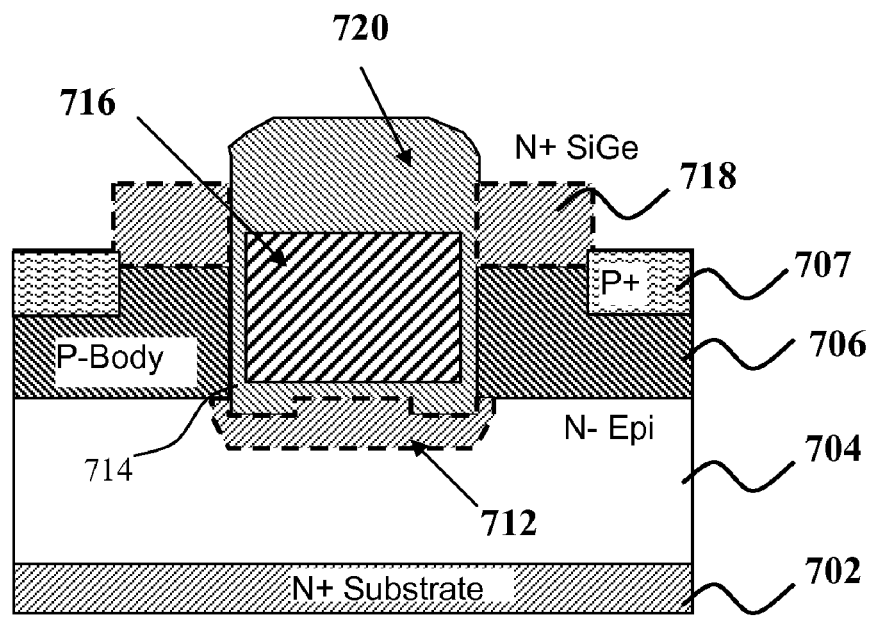
Figure 7F:
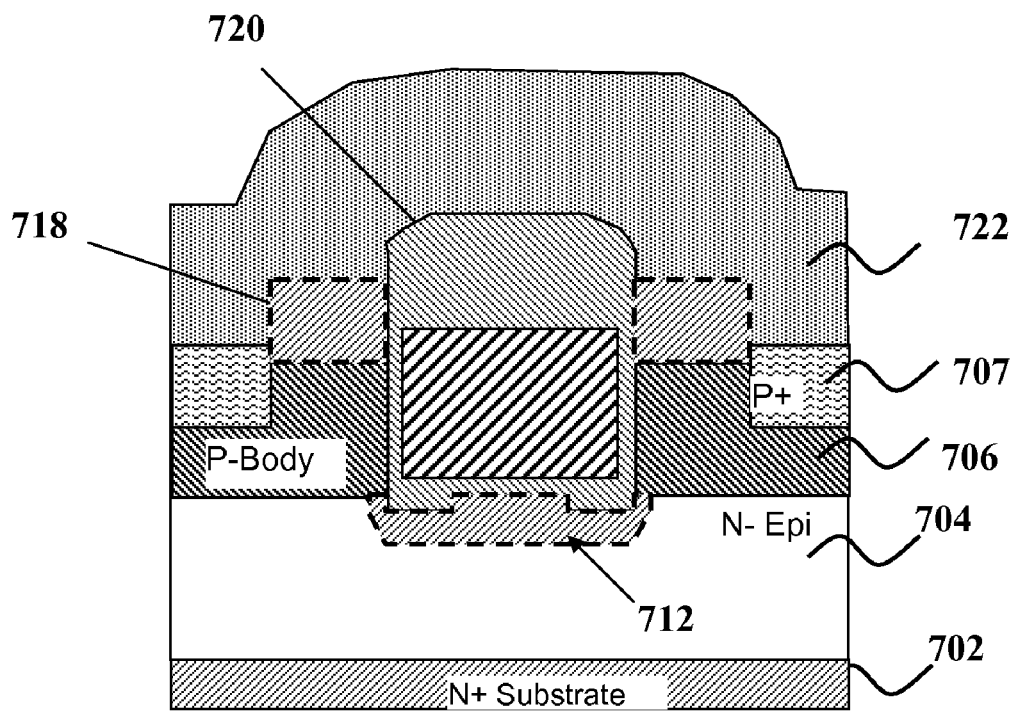

As shown in FIG. 7E, the mask 708 may be removed and a thin gate oxide 714 is deposited at the sidewall of the trench 709 and on top of the N-SiGe layer 712. N+ poly may then be deposited in the remaining open portions of the trench 709 to form poly gate 716. The Poly may then be etched back, and recessed below the original surface of the N-epi silicon layer 704. Oxide may be subsequently deposited and/or an oxide thermally grown (oxide tends to grow faster on the N+ polysilicon in the trench), and etched back, to expose the N-epi regions on each side of the gate trench 709. This forms a thick oxide region 720. N+ SiGe layers may then be selectively grown on the exposed surface of the P-Body layer 706, on each side of the oxide on top of the poly gate 716. The N+ SiGe is then patterned and etched to form a body contact 707 next to the N+ Source regions 718 on the P-body layer 706. A source metal 722 may be formed over the source regions 718 and thick oxide 720 to complete the device as shown in FIG. 7F.

Figure 8A:
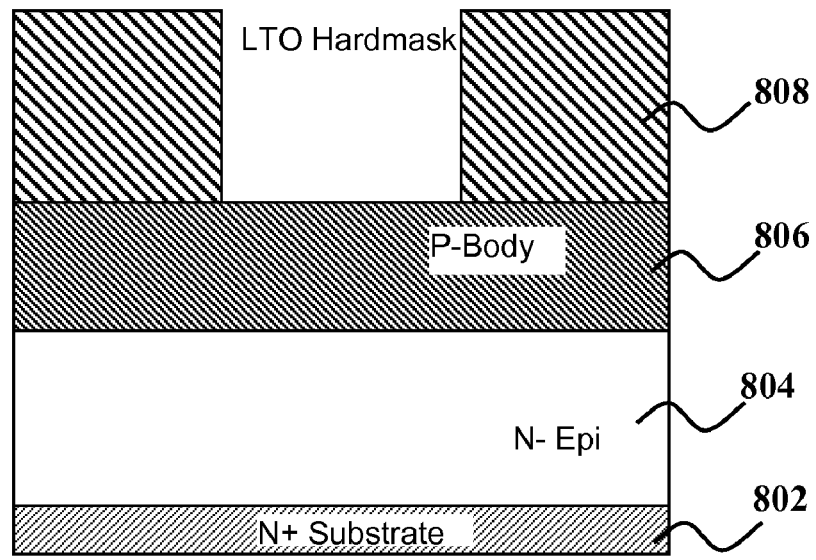
FIGS. 8A-8H are cross-sectional views illustrating a method of fabrication of P-type SiGe sidewall channel trench-gate DMOSFETs.

FIGS. 8A-8H illustrate an example of fabrication of N-channel SiGe sidewall channel trench-gate DMOSFETs of the type depicted in FIGS. 2A-2B. As shown in FIG. 8A, an N-type epitaxial (N-epi) semiconductor layer 804 may be formed on a major surface of a substrate 802. By way of example, the substrate 802 may be single crystal silicon highly N+ doped. The N-type epitaxial (N-epi) semiconductor layer 804 may be formed by any suitable epitaxial growth method on a major surface of the N+ substrate 802. Then, P-type dopants may be blanket implanted and diffused in a surface region of the N-epi semiconductor layer 804, thereby forming a P-type semiconductor layer 806. A hardmask 808 may be formed on a surface of the P-body layer 806 by a low temperature oxide (LTO) deposition, patterning and etch techniques.

Figure 8B:
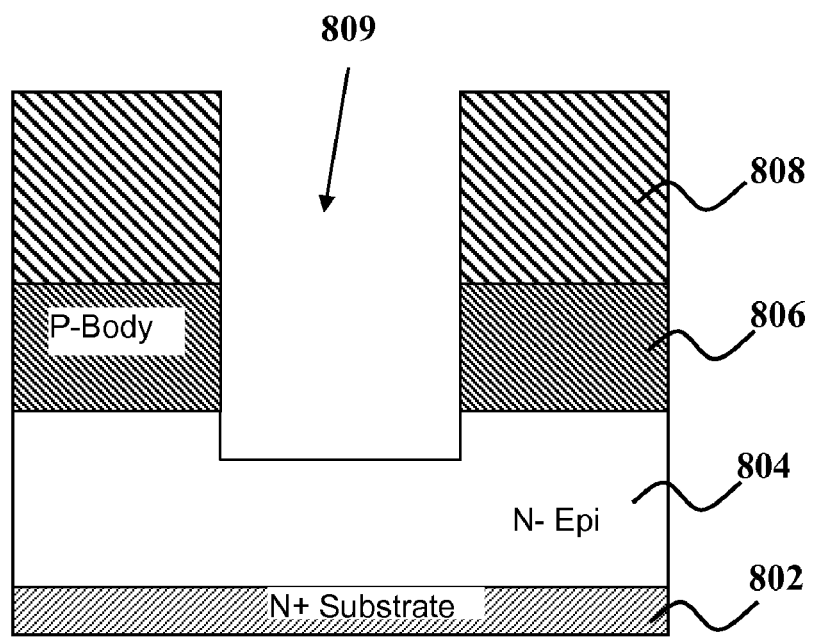
Figure 8C:
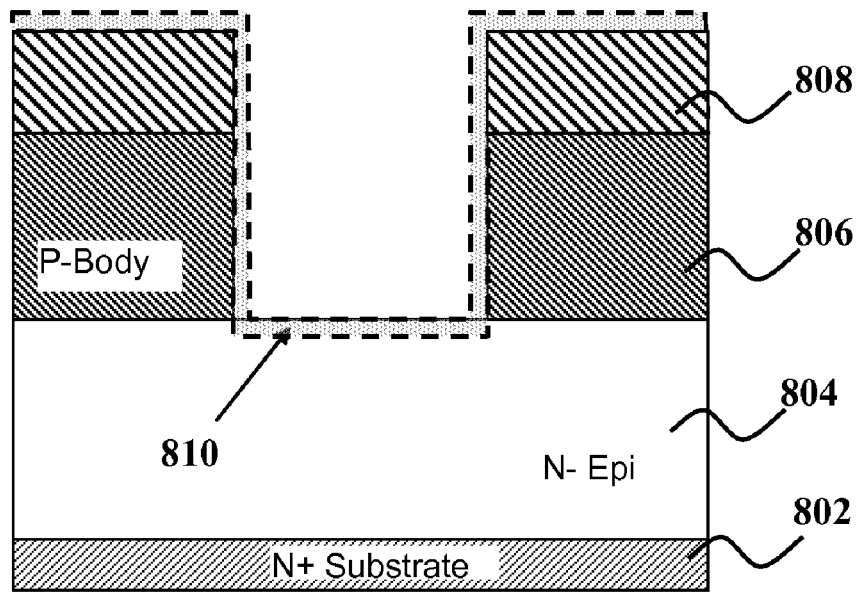
Figure 8D:
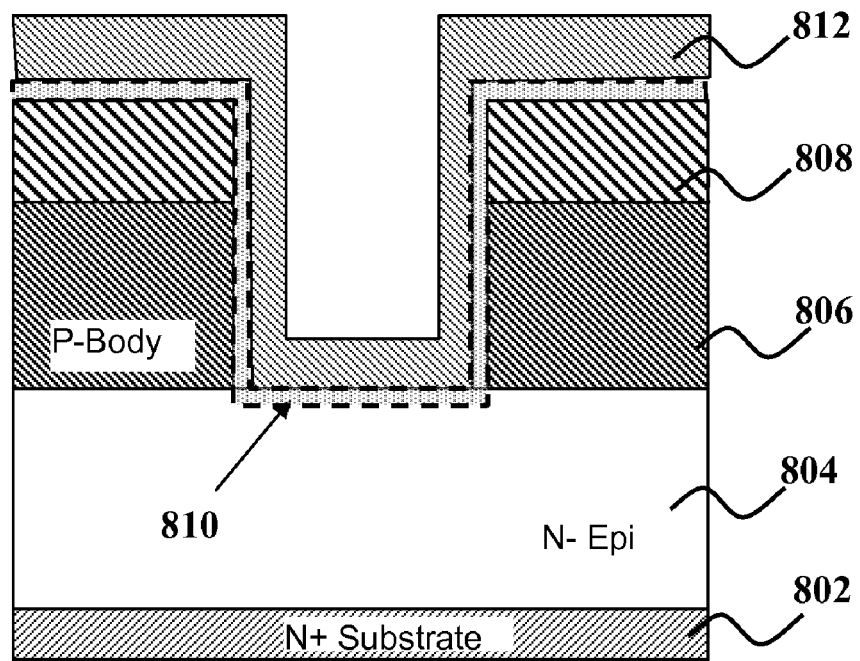

As shown in FIG. 8B, a trench 809 may be formed by reactive ion etching (RIE) through one or more openings in the hardmask 808. The trench 809 preferably penetrates through the P-body layer 806 such that the bottom of the trench 809 reaches the N-epi layer 804. As shown in FIG. 8C, undoped SiGe layer 810, may be formed, e.g., using blanket deposition or selective growth, e.g., of polycrystalline-SiGe on oxide layer 808 and single crystalline-SiGe on exposed silicon of P-body layer 806 on the sides of the trenches 809, and N-epi layer 804 at the bottom of the trench 809. The SiGe growth can be performed after an optional sacrificial oxide growth and etch, to improve the crystalline quality at the surface of the trenches. An oxide layer 812 may then be deposited on the top of the undoped SiGe layer 810 as shown in FIG. 8D.

Figure 8E:
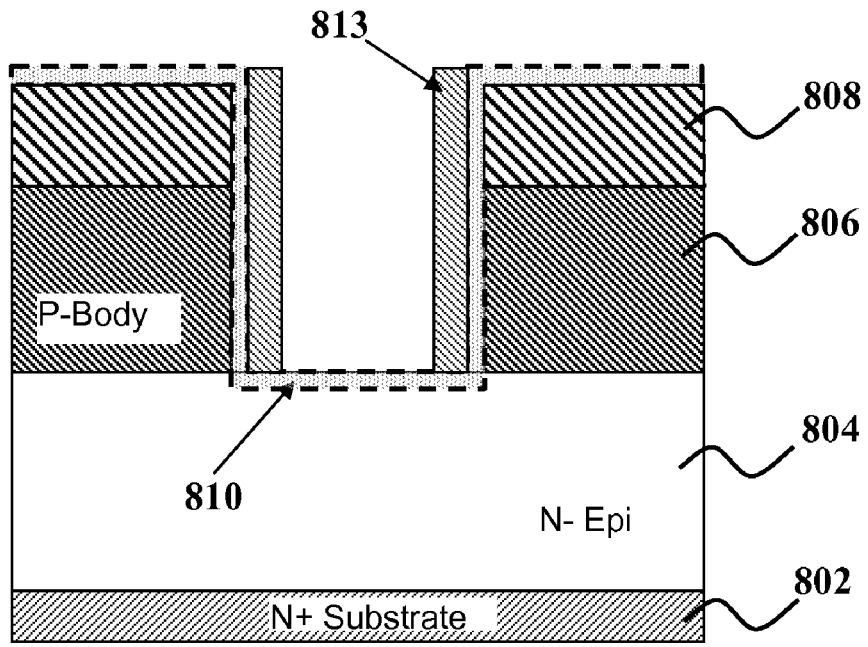
Figure 8F:
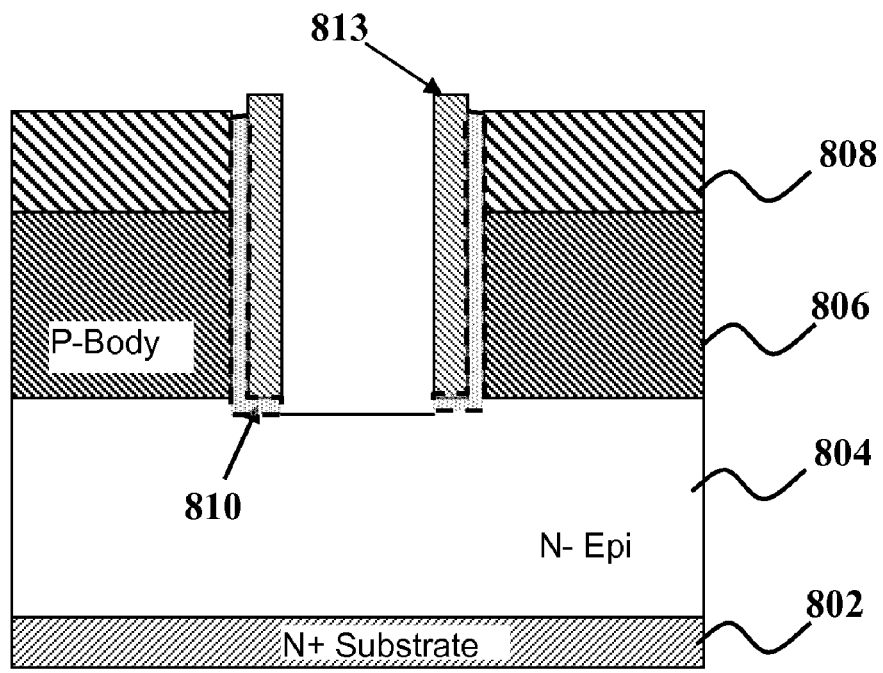
Figure 8G:
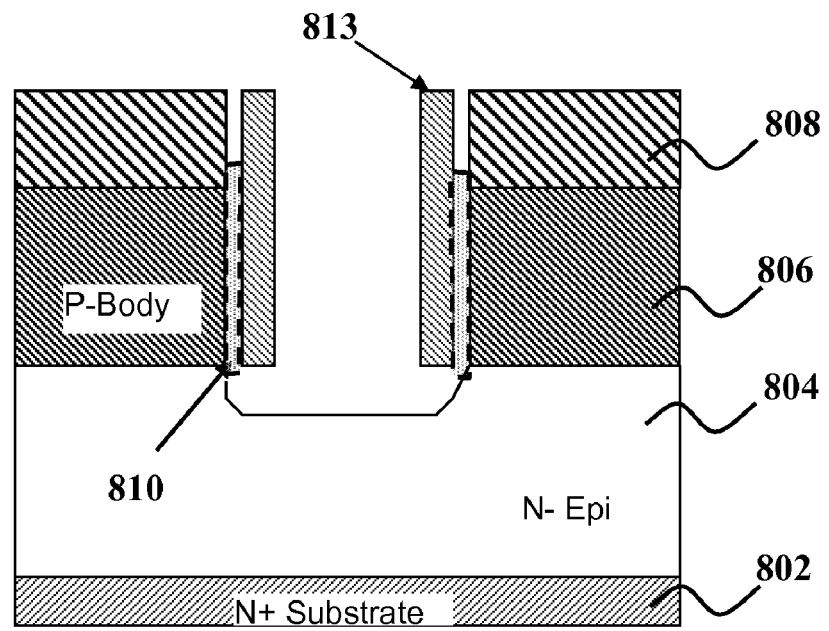
Figure 8H:
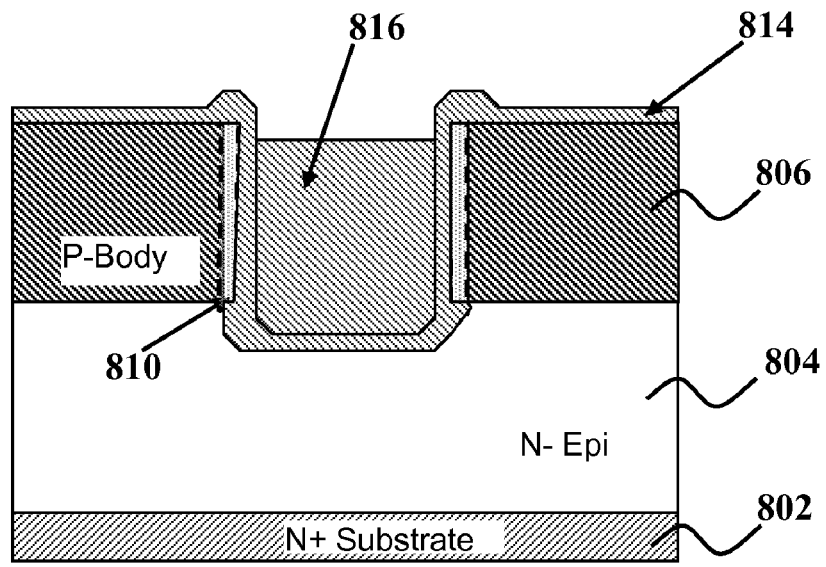

The oxide layer 812 may then be etched back leaving spacers 813 on the sidewalls of the trench 809 as shown in FIG. 8E. Portions of the undoped SiGe layer 810 overlying the hardmask 808 may then etched as shown in FIG. 8F. The undoped layer 810 and N-epi layer 804 may be isotropically etched, leaving a slight undercut as shown in FIG. 8G. The mask 808 and the spacer 813 may then be removed by etching. A gate oxide layer 814 may be formed over the exposed surface of the P-body layer 806, the bottom of the trench 809 and the undoped SiGe layer 810 remaining on the sidewalls of the trench 809 as shown in 8H. By way of example, the gate oxide layer 814 may be formed e.g., by high temperature oxide deposition (HTO) or by low temperature thermal oxidation. N+ polysilicon may then be deposited into the trench 809 and subsequently etched back to a predetermined depth to form a gate 816. The undoped SiGe layer 810 remaining on the sidewall of the trench 809 may be P-type doped, e.g., by thermal diffusion of dopants from nearby portions of the P-body layer 806, or by an optional doping step (tilted and rotated implants, gas phase doping, etc . . . ). The device may then be completed with suitable ion implantation to form source regions in the P-body layer 806 and formation of source metal (not shown).

With Vertical channel devices, the wafer crystal plane, and "flat" rotation, may be used to optimize the crystal plane over which the SiGe layer can be grown. This gives an additional means of optimizing the performance, which is not possible with planar structures. It is noted that different flat orientation may be used for the NMOS and PMOS devices. For example, some reference indicate that <100> plane is best for NMOS and <110> plane is best for PMOS. An example of such a reference is "Higher Mobility MOSFETS" by Michael Losinski and Anthony Kusnia, a copy of which may be accessed at:

http://www.d.umn.edu/~sburns/ECE3611Spring2005/ Higher%20Mobility%20MOSFETS.doc, the contents of which are incorporated herein by reference.

By using Trenches with Wafer-flat-rotation, NMOS and PMOS may be formed on the same wafer, and may be optimized by simply rotating the pattern to align the channel to the different preferred plans for NMOS and PMOS respectively.

The process for making trench DMOS is quite well established. In terms of SiGe material composition, in general the more Germanium in the film, the more the strain. Also, the thinner the layers, the more the Ge can be. Effectively, the SiGe can be defined as $Si_{(1-x)}Ge_{(x)}$ where x can be in the 5 to 40% range typically. Examples of techniques for SiGe deposition may include MBE (Molecular Beam Epitaxy) and preferably CVD using single wafer reactor with or without reduced pressure (below atmosphere) ambient, with load lock, lamp heating etc . . . Example suitable deposition systems include the Epsilon reactors from ASM International N.V. of Bilthoven, the Netherlands, and the Centura epi reactors from Applied Materials, of Santa Clara, Calif.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for manufacturing a high-mobility vertical trenched DMOS comprising:
   a) forming an N-type epitaxial (N-epi layer on top of an N+ substrate;
   b) forming a trench mask on top of the N-epi layer
   c) etching the N-epi layer through the trench mask to a predetermined depth to form a trench;
   d) filling the trench with a conductive material to form a gate;
   e) forming SiGe region proximate to the gate on a sidewall of the trench but not on a bottom of the trench or a surface of the N-epi layer, wherein the SiGe region is configured to increase a mobility of charge carriers in a channel region, wherein forming the SiGe region comprises:
   forming an oxide spacer on the trench sidewall;
   isotropically etching a portion of the N-epi layer at a bottom of the trench;
   selectively growing an N-type SiGe region on the portion of the N-epi layer that was isotropically etched;
   etching the oxide spacer and the trench mask; and
   forming a gate oxide layer on the N-type SiGe on the sidewall of the trench; and
   f) forming a P-body layer on the surface of the N-epi layer.

2. The method of claim 1 wherein step d) is performed before step e).

3. The method of claim 2 further comprising, before step d):
   removing the trench mask; and
   forming a gate oxide on the gate.

4. The method of claim 3, wherein step f) includes:
   implanting and diffusing the top region of the N-epi layer to form the P-body layer; and
   forming a poly oxide layer on top of the gate; and
   etching the oxide layer on top of the P-body layer.

5. The method of claim 4, further comprising, after step f):
   selectively growing N+ SiGe region on top of the P-body layer; and
   etching back the N+ SiGe region to a predetermined width to form a source region.

6. The method of claim 2 further comprising forming a gate oxide before step d).

7. The method of claim 6, wherein step f) includes:
   implanting and diffusing a top region of the N-epi layer to form the P-body layer;
   removing the trench mask; and
   forming an oxide layer over the gate.

8. The method of claim 7, further comprising, after step f):
   selectively growing N+ SiGe region on top of the P-body layer; and
   etching back the N+ SiGe region to a predetermined width to form a source region.

9. The method of claim 1, wherein step e) is performed before step d).

* * * * *